United States Patent [19]
Miyazawa et al.

[11] Patent Number: 5,571,748
[45] Date of Patent: Nov. 5, 1996

[54] METHODS FOR PRODUCING COMPOUND SEMICONDUCTOR DEVICES

[75] Inventors: Seiichi Miyazawa, Zama; Natsuhiko Mizutani, Atsugi, both of Japan

[73] Assignee: Canon Kabushiki Kaisha, Tokyo, Japan

[21] Appl. No.: 409,635

[22] Filed: Mar. 22, 1995

Related U.S. Application Data

[63] Continuation of Ser. No. 35,194, Mar. 22, 1993, abandoned.

[30] Foreign Application Priority Data

Mar. 26, 1992 [JP] Japan .................................. 4-100709
Jun. 12, 1992 [JP] Japan .................................. 4-179389

[51] Int. Cl.$^6$ .................................................. H01L 21/265
[52] U.S. Cl. ........................................... 437/107; 437/133
[58] Field of Search .................................... 437/107, 133

[56] References Cited

U.S. PATENT DOCUMENTS

| | | |
|---|---|---|
| 4,395,293 | 7/1983 | Knechtli et al. . |
| 4,680,616 | 7/1987 | Delahoy et al. ........................ 437/170 |
| 4,794,611 | 12/1988 | Hara et al. ............................. 372/45 |
| 4,932,033 | 6/1990 | Miyazawa et al. .................... 372/46 |
| 5,084,743 | 1/1992 | Mishra et al. . |
| 5,115,443 | 5/1992 | Miyazawa et al. .................... 372/46 |
| 5,116,767 | 5/1992 | DeChiaro et al. ....................... 437/7 |
| 5,162,242 | 11/1992 | Tamura et al. ......................... 437/22 |

FOREIGN PATENT DOCUMENTS

| | | |
|---|---|---|
| 094615 | 4/1988 | Japan . |
| 218063 | 8/1989 | Japan . |

OTHER PUBLICATIONS

Patent Abstracts of Japan, vol. 10, No. 175 (E–413), Jun. 20, 1986 & JP–A–61–026216 (Kogyo Gijutsuin), Feb. 5, 1986.

Applied Physics Letters, vol. 50, No. 1, Jan. 5, 1987, USA, pp. 31–33, J. W. Lee et al., "Defect Reduction by Thermal Annealing of GaAS Layers Grown by Molecular Beam Epitaxy on Si Substrates".

English translation of "Damage removal in III–V compound semiconductor via minority carrier injection" in Applied Physics vol. 161, No. 2, Feb. 149–153, 1992.

S. Miyazawa, et al "Low–Temperature Molecular Beam Epitaxy Growth of Single Quantum Well GaAs/AlGaAs Lasers" J.J.A.P. vol. 30, 5B (1991) pp. L921–L923.

H. Y. Cho, et al, "Creation of deep levels in horizontal Bridgman–grown GaAs by hydrogenation" Appl. Phys. Lett 53 (10) (1988) pp. 856–858.

H. Künzel, et al. "Quantitative Evaluation of Substrate Temperature Dependence of Ge Incorporation in GaAs During Molecular Beam Epitaxy" Appl. Phys. 22 23–30 (1980).

M. Ohtsuka et al, "Model for Molecular–beam Epitaxy Growth Over Non–planar Surfaces", J. of Applied Physics, vol. 64, No. 7, Oct. 1, 1988 pp. 3522–3527.

W. C. Tsang; "Extremely Low Threshold (Al/Aa) As Modified Multiquantum With Heterostructure Lasers Grown by Molecular Beam Epitaxy", Applied Physics Lett., vol. 39, No. 10, Nov. 15, 1981, pp. 786–788.

Y. Horikoshi et al., "Low temperature grown of GaAs and AlAs–GaAs Quantum Wall layers by Modified Molecular Beam Epitaxy" Jap. J. of Applied Physics, vol. 25 No. 10, Oct. 1986, pp. L868–870.

(List continued on next page.)

*Primary Examiner*—Robert Kunemund
*Attorney, Agent, or Firm*—Fitzpatrick, Cella, Harper & Scinto

[57] ABSTRACT

In a method for producing a compound semiconductor device such as laser diodes, FET and HEMT, compound semiconductor is grown at a substrate temperature not greater than 500° C. to form a semiconductor layer on a substrate of the semiconductor device. Then, an appropriate treatment, such as heat-treatment in reducing atmosphere, current flow treatment and hydrogen plasma treatment, is conducted to reduce crystal defects in the semiconductor layer attributable to the crystal growth at the low substrate temperature not greater than 500° C.

7 Claims, 19 Drawing Sheets

OTHER PUBLICATIONS

H. Sakaki et al., "One Atomic Layer Heterointerface Fluctuations in GaAs–AlAs Quantum well Structures and Their Suppression by Insertion of Smoothing Period in Molecular Beam Epitaxy", vol. 24, No. 6, Jun. 1985 pp. L417–L420, Jap. J. of Appl. Physics.

W. T. Tsang, "The effect of Substrate Temperature on the Current Threshold of $GaAs_xGa_{y-x}As$ Double–Heterostructure Lasers Grown by Molecular Beam Epitaxy" Applied Physics Letters, vol. 36, No. 2, Jan. 15, 1980, pp. 118–120.

T. Fujii et al., "Very Low Threshold Current GaAs–AlGaAs–GRIN–SCH Lasers Grown by MBE for OEIC Applications" J. Vacuum Sci. & Tech. B vol. 2, No. 2, Apr.–Jun. 1984; pp. 259–261.

FIG.8

STEP 1

FORM QUANTUM WELL BY MBE

○ SUBSTRATE TEMPERATURE 400°C

○ V/III RATIO 1.1

STEP 2

ANNEAL IN 100% HYDROGEN ATMOSPHERE AND UNDER 1 ATMOSPHERIC PRESSURE

○ 700°C

○ 0.5 HOUR

FIG.11

STEP 1

FORM LAYERS BY MBE

○ SUBSTRATE TEMPERATURE 425°C

○ V/III RATIO 1.1

↓

STEP 2

THERMALLY PROCESS IN 100% HYDROGEN
FLOW AND UNDER 1 ATMOSPHERIC PRESSURE

○ 700°C

○ 1 HOUR

METHODS FOR PRODUCING COMPOUND SEMICONDUCTOR DEVICES

This application is a continuation of application Ser. No. 08/035,194 filed Mar. 22, 1993, now abandoned.

BACKGROUND OF THE INVENTION

1. Field of the Invention

This invention relates to methods for producing semiconductor devices, in which a substrate or a layer formed thereon is composed of GaAs, AlGaAs, Si, ZnSe or the like, and their substrate or growth temperatures are relatively low, for example, not greater than 500° C. In such methods, crystallinity or crystallization of the devices is improved by an appropriate process conducted after the layer-growth process. The method is preferably utilized as a method of producing a semiconductor device which includes a sharp and flat compound semiconductor hereto-interface or boundary plane, typically, a quantum well structure having a hetero boundary plane of two flat compound semiconductors.

2. Related Background Art

It has been conventionally known that a boundary plane having a steep composition profile in a direction perpendicular to a substrate plane can be readily formed by controlling a supply of m group (e.g., Al) molecules when a hereto-junction between different kinds of III–V group compound semiconductors (e.g., GaAs and AlGaAs) is fabricated by the molecular beam epitaxy (MBE) method.

This kind of crystal growth of III–V group compound semiconductors by MBE is generally two or three dimensional growth from a growth core, and the hereto boundary plane is formed at an arbitrary timing by opening or closing of a shutter for controlling the supply of III group molecules. In this hetero-interface, there is a step of at least one atomic layer in a plane parallel to the substrate plane. The existence of the step can be known from the fact that a plurality of peaks appear in photoluminescence from AlGaAs/GaAs quantum well structure or GaAs/AlAs quantum well structure, and that an energy interval between the peaks is equal to a difference in a bound-state energy in the quantum well occurring when the thickness of quantum well is changed by one atomic layer. For example, it is reported that the boundary plane becomes flat by momentary interruption of the crystal growth at the hetero interface (see Jpn. J. Appl. Phys. 24, 1417 (1985).

Further, the crystal growth by the migration enhanced epitaxy (MEE) method is also known. For example, it is reported that crystal having excellent crystallinity and interface flatness can be obtained by MEE in which Ga and As are alternately grown one by one atomic layer (see Jpn. J. Appl. Phys. 25, 868 (1986)).

Following techniques are also known:

Conventionally, it has been reported that the threshold current density of a semiconductor laser fabricated by the molecular beam epitaxy (MBE) method was raised when the semiconductor laser was produced at a growth temperature in a relatively low temperature range as, for example, Appl. Phys. Lett. Vol. 36, p. 118 (1980) W. T. Tsang et al. discloses. FIG. 1 shows the structure of such laser. FIG. 2 illustrates the relationship between the threshold current density $J_{th}$ and the substrate temperature.

In FIG. 1, there are formed, on an n-GaAs substrate 201, an Si doped GaAs buffer layer 202 having a thickness of 0.5 µm, an Si doped $Al_{o.3}Ga_{o.7}As$ layer 203 having a thickness of 1.5 µm, an undoped GaAs active layer 204 having a thickness of 0.1 µm, a Be doped $Al_{o.3}Ga_{o.7}As$ layer 205 having a thickness of 1.5 µm, a Be doped GaAs contact layer 206 having a thickness of 0.5 µm and a Cr/Au alloy electrode 207 deposited on the contact layer 206. After the n-GaAs substrate 201 is thinned to a thickness of approx. 100 µm, an AuGe/Ni/Au electrode 208 is deposited on the bottom surface of the substrate 201.

As is seen from FIG. 2 showing a substrate temperature dependency of threshold current density $J_{th}$ of the thus fabricated laser which has a stripe width of 100 µm and a cavity length of 300 µm, the $J_{th}$ of such laser is small near the substrate temperature of 650° C. Namely, its performance is improved when near such substrate temperature. In contrast, $J_{th}$ becomes greater than 14 kA/cm$^2$ in the vicinity of substrate temperature of 300° C. This value of threshold current density far surpasses the value of about 3 kA/cm$^2$ below which a laser can practically be utilized. Thus, it is seen that the characteristic of a laser is lowered at such low substrate temperatures.

In recent years, there has been a growing interest in opto-electronic integrated circuits (OEIC) in which optical devices and electric or electronic devices are integrated on a common substrate (see J. Vac. Sci. Technol. B2(2), 259 (1984), Very low threshold current GaAs-AlGaAs GRIN-SCH lasers grown by MBE for OEIC applications). The OEIC features an enhanced reliability, relatively low cost, compactness in size and so forth, and is considered an important technology. However, its fabrication temperature becomes a problem when the integration is conducted.

That is, in conventional methods, the fabrication or substrate temperature is high when devices are produced, and hence inter-diffusions of composite elements and impurities are caused, leading to incapability of creating ideal doping profiles or distributions and ideal structures. As is described above, optical devices such as semiconductor lasers are usually fabricated at temperatures greater than 600 ° C., and presently at still higher temperatures of about 700° C. in order to better their performances. In contrast, electronic devices are principally produced at the growth temperature of about 500° C. so that inter-diffusions of impurities or the like should be prevented. So, there is presently a temperature difference of about 200 ° C. between fabrication temperatures of optical devices and electronic devices.

Therefore, electronic devices are always produced after optical devices have been fabricated in order to achieve their integration while maintaining good characteristics of the electronic devices. Thus, the fabrication process becomes complicated since a plurality of epitaxial growths having different steps are to be conducted.

FIG. 3 illustrates an example of diffusion in Si doped GaAs. As seen from FIG. 8, an ideal doping shape 182 in fact severely collapses at the growth temperature of 550° C. as indicated by a line 183.

As discussed in the foregoing, a low temperature growth is a critical technique in semiconductor processes. In particular, a low temperature growth of semiconductor lasers which are key optical devices is important for the integration of optical and electronic devices.

A hetero-epitaxy technique for growing a III–V group compound semiconductor such as GaAs on an Si substrate has been particularly highlighted in recent years in light of hetero-junctions with lattice mismatching. If GaAs and the like can be grown on an Si substrate, a less expensive substrate having a large area becomes available, and hence the following advantages will be obtained. ① A highly efficient solar battery can be obtained. ② It becomes possible to monolithicly form Si and GaAs materials, and hence OEIC's with satisfying performances can be achieved. ③ High speed GaAs ICs and high electron mobility transistor (HEMT) ICs can be fabricated on a substrate having a large area. ④ Heat radiation of power devices and semiconductor devices is improved because Si has a larger thermal conductivity than GaAs.

However, such growths are difficult to attain by usual methods since there exist 4% lattice mismatching and a difference in thermal expansion coefficients between Si and GaAs.

There have been developed the following methods for alleviating the lattice mismatching between Si and GaAs. ① A GaAs/Ge/Si structure is fabricated using an intermediate layer of Ge. ② After an Si substrate is cleaned at high temperatures, a thin, amorphous GaAs layer is grown at low temperatures and the temperature is raised in order to grow GaAs at normal growth temperatures. This is a two-step growth method for obtaining a structure of GaAs/low temperature GaAs/Si. ③ A GaAs/AlGaAs super-lattice is grown on Si and then GaAs is grown thereon to produce a structure of GaAs/GaAs-AlGaAs super-lattice/Si. ④ A strain super-lattice is formed as an intermediate layer to obtain a structure of GaAs/strain super-lattice/Si.

The MBE and metal organic-chemical vapor deposition (MOCVD) methods are used for growth of layers, and single crystal GaAs has been obtained in all of those methods.

Samples of various devices such as FETs, solar batteries and semiconductor lasers are made using GaAs grown on Si. It has also been reported that a GaAs/AlGaAs double hetero-laser fabricated on a Si substrate was successfully radiated at room temperature, though this is inferior to those grown on a GaAs substrate in characteristics.

FIGS. 4. 5A and 5B show characteristics of such example and its structure. In FIG. 4, an MOCVD apparatus at normal temperatures is used. There are provided, on an n-type Si substrate 171 of (100) 2° off, a GaP layer 172 having a thickness of 0.1 μm formed at temperature of 900° C., a GaP/GaAsP strain super-lattice (20 nm/20 nm×5) layer 173 formed at 750° C., an n-GaAs layer 174 having a thickness of 2 μm and impurity concentration of $2\times10^{18} cm^{-3}$, an n-$Al_xGa_{l-x}As$ lower cladding layer 175 having a thickness of 1.4 μm and impurity concentration of $1\times10^{18} cm^{-3}$, an undoped GaAs active layer 176 having a thickness of 0.08 μm, a p-$Al_xGa_{l-x}As$ upper cladding layer 177 having a thickness of 1.4 μm and impurity concentration of $4\times10^{17}$ $cm^{-3}$ and a p-GaAs layer 178 having a thickness of 0.65 μm and impurity concentration of $1.3\times10^{18}$ $cm^{-3}$. On this structure, an Au-Zn/Au electrode 180 is deposited at a p-side while an Au-Ge/Au electrode 181 is deposited at an n-side. Its stripe width and cavity length are respectively set to 10 μm and about 100 μm.

FIG. 5A illustrates the characteristic of a laser formed on a GaAs substrate, and FIG. 5B illustrates the characteristic of the above-mentioned laser produced on Si substrate 171. It can be seen therefrom that oscillations of the TE+TM mode and TM mode occur in the laser on Si while an oscillation of only TE mode is caused in a double-hereto (DH) laser on GaAs. This phenomenon is considered to be attributable to the fact that the GaAs layer grown on Si receives a strain of about $10^9$ dyn/$cm^2$ since the thermal expansion coefficient is different between Si and GaAs and that its degenerated hole energy level is split to create light and heavy hole levels.

Thus, although the laser oscillation is somehow achieved in the laser still produced on a Si substrate with improvement, such semiconductor laser has the following drawbacks.

① Presently, a GaAs layer grown on Si substrate has an etch pit of $1\times10^6$ $cm^{-2}$, but the value of the etch pit is preferably less than $1\times10^{-3}$ $cm^{-2}$ in light of the lifetime of lasers. ② The GaAs laser is produced at a high temperature of 700° C., and hence a large stress occurs due to the difference in thermal expansion coefficient between Si and GaAs. In fact, this influence appears in the laser characteristic of TM mode oscillation and the like.

Thus, strain and the like have not yet been solved completely due to the differences in lattice constants between Si and GaAs and in thermal expansion coefficient, and the lifetime of laser is adversely affected. Unless those problems are solved, it is difficult to reduce such semiconductor lasers fabricated on the Si substrate into practice.

Next, a compound technique of semiconductor materials is important for optical communication technique, display technique and the like.

For example, it has been attempted to integrate semiconductor materials corresponding to three primary colours of light on a common substrate for satisfying requirements of flat panel displays and the like. As examples of such materials, AlGaAs can be cited for red colour, GaP for yellow, and ZnSe for blue. A GaAs substrate can generally be cited as a substrate. Lattice constants of AlGaAs, GaP and GaAs are generally equal to each other, and light emitting diodes and semiconductor lasers and the like using these materials are already reduced into practice. Devices using ZnSe, however, have not yet been employed practically. This is because a proper doping of ZnSe is hard to perform and because the growth temperature of ZnSe is quite different from that of GaAs layers. In general, an optimum growth condition of ZnSe resides in a range between 250° C. and 350° C. while that of GaAs is in a range higher than 500° C.

Therefore, it has been usual in conventional growth examples to fabricate ZnSe on the GaAs substrate at temperatures from 250° C. to 350° C. If a GaAs layer were grown on a ZnSe layer, inter-diffusions of Ga, As, Zn and Se occur and an n-p junction would be formed at a boundary plane between GaAs and ZnSe.

FIGS. 6 and 7 show such examples. In FIG. 6, an n-ZnSe layer 152 is formed on an n-GaAs substrate 151. The growth temperature therein is 300° C. Then, as shown in FIG. 7, an n-GaAs layer 153 is grown at the growth temperature of 500° C. At this time, Zn is diffused from the ZnSe layer 152 to the GaAs layer 153. As a result, part 155 of the GaAs layer 153 becomes a p-type GaAs region. Similarly, Ga is diffused from the GaAs layer 153 to the ZnSe layer 152 and an n-type region 154 is formed in the ZnSe layer 152. Consequently, an npn junction is created between substrate 151 and GaAs layer 153.

Thus, except for the junction between n-ZnSe and p-GaAs, such a device having a diode characteristic will inevitably be created since there is a great difference in growth temperature between ZnSe and GaAs. This is a great obstacle to the achievement of ZnSe devices. Further, if GaAs is grown at low temperatures, many crystalline defects would occur.

In order to fabricate an efficient light emitting device, such material having a different band gap from ZnSe and at the same Lime having a lattice constant equal thereto is needed. As materials satisfying these conditions, GaAs and AlGaAs series are considered appropriate.

Thus, a need for technique to grow GaAs and so forth on ZnSe layer is great. If such technique is established, it becomes possible to integrate light emitting devices including a ZnSe layer, GaAs devices, ZnSe devices, GaP devices and so forth on a common substrate. Further, this technique is an important technique for crystal growth of II–VI group systems whose growth temperature is generally low.

However, in the above-discussed growth interruption method for achieving a flat boundary plane, it is necessary to interrupt the crystalline growth the moment III group atoms for forming one atomic layer are supplied, and if the timing of interruption is a little off, an island inevitably remains though the diameter of the island having a step difference of one atomic layer can be made larger than the radius of excitons. An example thereof is shown in FIG. 9B, which illustrates this example by comparison with an embodiment of the present invention shown in FIG. 9A. In FIG. 9B, reference numeral 1 designates an island having a step difference of one atomic layer and reference numeral 2 designates an exciton.

Further, the above-discussed MEE method for obtaining crystal having excellent crystallinity and boundary-plane flatness is not suitable for mass production since the rate of crystal growth is exceedingly slow.

Furthermore, the above-discussed semiconductor layers grown at low temperatures have a comparatively large number of crystal defects, and hence are inferior to layers grown at normal or relatively high growth temperatures.

SUMMARY OF THE INVENTION

It is an object of the present invention to provide a method for producing compound semiconductor devices, whose crystallinity is improved, in order that high quality crystal layers can be fabricated on a substrate made up of material different therefrom, at low temperatures, so that inter-diffusions are eliminated and that stresses due to the difference in thermal expansion coefficient are suppressed.

It is another object of the present invention to provide a method for producing semiconductor devices, whose crystallinity and boundary-plane flatness are improved, at low growth temperatures.

The present invention is generally directed to a method of fabricating a semiconductor device which includes a step of growing a compound semiconductor at a substrate temperature not greater than 500° C. to form a semiconductor layer on a substrate of the devic, and a step of reducing crystal defects of the semiconductor layer attributable to the growth at the low substrate temperature not greater than 500° C.

According to one aspect of the present invention, a method for producing a compound semiconductor device is characterized in that a compound semiconductor containing at least, for example, III and V group elements is grown by the vacuum deposition at a substrate temperature not greater than 500° C. to form semiconductor layers of the semiconductor device, and that the thus fabricated semiconductor device is heat-treated in reducing atmosphere containing hydrogen or the like.

According to another aspect of the present invention, a method for producing a compound semiconductor device is characterized in that a crystal layer of the device is formed on a substrate with materials belonging to at least two different groups of the periodic law table, at a crystal growth temperature not greater than or below 500° C., and that a current is caused to flow into the thus formed crystal layer.

According to the present invention, a substrate temperature at the time of growth of compound semiconductor hereto-interface is set to a value not greater than 500° C., and the diameter of an island having a step difference of one atomic layer is reduced, so that an effectively flat boundary plane is formed for excitons in the quantum well or carriers in the vicinity of the boundary plane. Then, heat-treatment is conducted to correct crystal defects due to the low-temperature growth. As a result, the semiconductor device including epitaxial layers and having excellent crystallinity and interface flatness can be fabricated.

More concretely, in the first step in which the substrate temperature is below 500° C. and layers are formed in vacuum by a deposition method such as MBE, the growth of layers is conducted under a condition that the flux ratio of numbers of V / III group incoming molecules (a value of the number of V group incoming molecules whose vapor pressure is high divided by the number of m group incoming molecules whose vapor pressure is low) is maintained not greater than 2.5 (preferably below 2). As a result, a high quality crystal growth can be obtained (in this connection, see the copending U.S. application of the same assignee). At the time of crystal growth, the diameter of an island having a step difference of one atomic layer is reduced, and an effectively flat boundary plane can be fabricated for excitons in the quantum well or carriers in the vicinity of the boundary plane.

Then, crystal defects are corrected by raising a temperature in the reducing atmosphere to more than the substrate temperature at the time of layer growth. At this time, side effects, such as destruction of quantum well structure, diffusion of dopants and removal of As atoms from the surface, will occur if the heat-treatment temperature would be too high or the process time would be too long. When the heat treatment is performed in hydrogen at temperatures from 500° C. to 800° C. for a period from 10 minutes to 120 minutes, no side effects occur or side effects are so small as to be negligible.

Further, defects in the crystal are reduced by subjecting the semiconductor layer grown at low temperatures to the current flow treatment.

According to still another aspect of the present invention, a method for producing a compound semiconductor device is characterized in that a compound semiconductor containing at least, for example, III / V group elements is grown by a vacuum deposition at the substrate temperature below 500° C. to form semiconductor layers of the semiconductor device, and that the thus fabricated semiconductor device is subjected to a hydrogen plasma processing.

According to still another aspect of the present invention, a method for producing a compound semiconductor device is characterized in that a crystal layer of the device is formed on a substrate with materials belonging to at least two different groups of the periodic law table, at a crystal growth temperature below 500° C., and that the crystal layer is subjected to a hydrogen plasma processing at a temperature not greater than the crystal growth temperature to improve radiation efficiency and so forth.

According to the present invention, the substrate temperature at the time of growth of compound semiconductor hetero-interface is set to a value not greater than 500° C., and the diameter of an island having a step difference of one atomic layer is reduced, so that an effectively flat boundary plane is formed, for example, excitons in the quantum well or carriers in the vicinity of the boundary plane. Then, the hydrogen plasma process is conducted to correct crystal defects due to the low-temperature growth. As a result, the semiconductor device including epitaxial layers having excellent crystallinity and boundary plane flatness can be produced.

More concretely, in the first step in which the substrate temperature is below 500° C. and layers are formed in vacuum by a deposition method such as MBE, the growth of layers is conducted in a condition under which the flux ratio of numbers of V / III group incoming molecules is maintained below 2.5 (preferably below 2). As a result, a high quality crystal growth can be obtained. At the time of crystal growth, the diameter of an island having a step difference of one atomic layer is reduced, and an effectively flat boundary plane can be fabricated, for example, excitons in the quantum well or carriers in the vicinity of the boundary plane.

Then, crystal defects are corrected by conducting the hydrogen plasma process at a temperature not greater than the substrate temperature at the time of layer growth. At this time, side effects, such as destruction of quantum well structure, diffusion of dopants and removal of As atoms from the surface, will occur if the temperature of the hydrogen plasma process would be too high or the process time would be too long. When the heat treatment in the hydrogen plasma is performed at an appropriate temperature for an appropriate period, no side effects occur or side effects are so small as to be negligible.

In the above method, impurity levels in the crystal are lowered by performing two steps, i.e., the first step or step 1 of fabricating semiconductor layers at low temperatures and the second step or step 2 of applying atomic hydrogens (hydrogens in plasma state) onto the grown semiconductor layers.

In the step 1 of performing low temperature growth of GaAs, AlGaAs and the like, the V / III flux ratio is made small so that the migration length of constituent elements at low temperatures is improved or elongated. In contrast, the crystallinity improvement of the crystal grown at low temperatures is achieved by using the hydrogen plasma. Effects due to the hydrogen processing will be described.

If semiconductor layers are formed at low temperatures, Deep Levels (i.e., an impurity level that has an energy gap sufficiently greater than heat energy at room temperature (26 meV). In contrast to a shallow level such as donor and acceptor levels) that would not attribute to radiation, will be formed in the crystal. The Deep Level has been proven to be electrically inactivated by the diffusion of hydrogen atoms. The hydrogen atoms will tend to diffuse into the semiconductor at low temperatures from 200° C. to 400° C., and inactivate the Deep Levels that act as a non-radiation center. This effect is measured by using the deep level transient spectroscopy (DLTS) method. The DLTS method is a method for measuring deep levels created in the semiconductor, by utilizing the change in capacitance. FIG. 20 shows that effect.

In FIG. 20, the ordinate indicates the concentration of deep levels, and the abscissa indicates measured temperature. Reference numeral 103 designates a curve showing the deep level concentration of the sample measured right after the growth. It can be seen that the concentration of deep level is large. In contrast, reference numeral 102 indicates a curve showing the deep level concentration measured after the two-hour hydrogen plasma processing, and it can be seen therefrom that the concentration is less than one hundredth of the concentration right after the growth. This fact demonstrates that the deep level is inactivated by the hydrogen plasma processing. The substrate temperature at the time of hydrogen plasma process is as low as approx. 300° C., and it has been shown that a high quality all-low-temperature process can be achieved by a combination of the above process of the present invention and the low-temperature growth method.

These advantages and others will be more readily understood in connection with the following detailed description of tile preferred embodiments in conjunction with the drawings.

BRIEF DESCRIPTION OF THE DRAWINGS

FIG. 8 is a view showing process steps of a first embodiment of a method for producing a semiconductor laser according to the present invention.

FIG. 11 is a view showing process steps of a second embodiment of a method for producing a semiconductor laser according to the present invention.

DESCRIPTION OF THE PREFERRED EMBODIMENT

Figure 1:
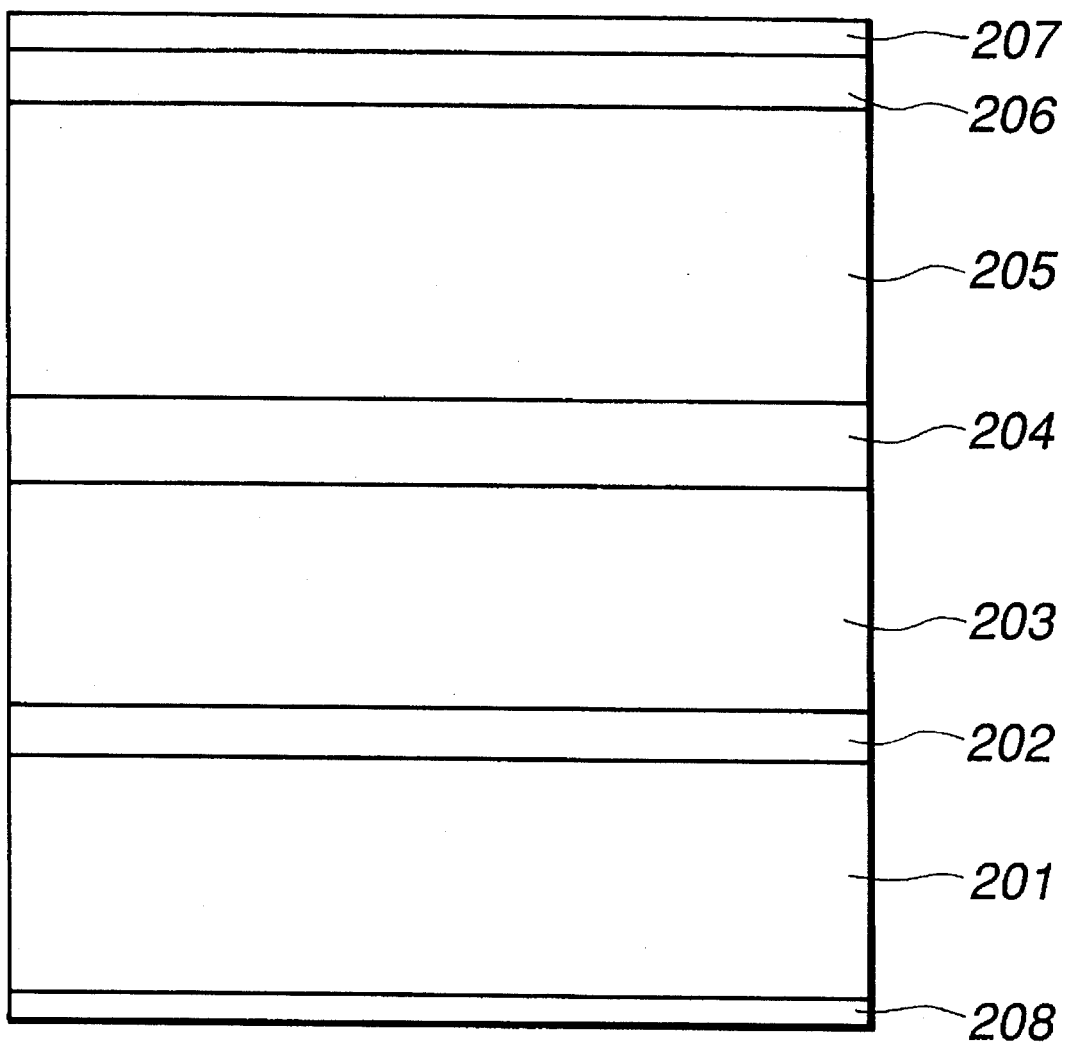
FIG. 1 is a cross-sectional view for explaining a prior art example of a semiconductor laser.
Figure 2:
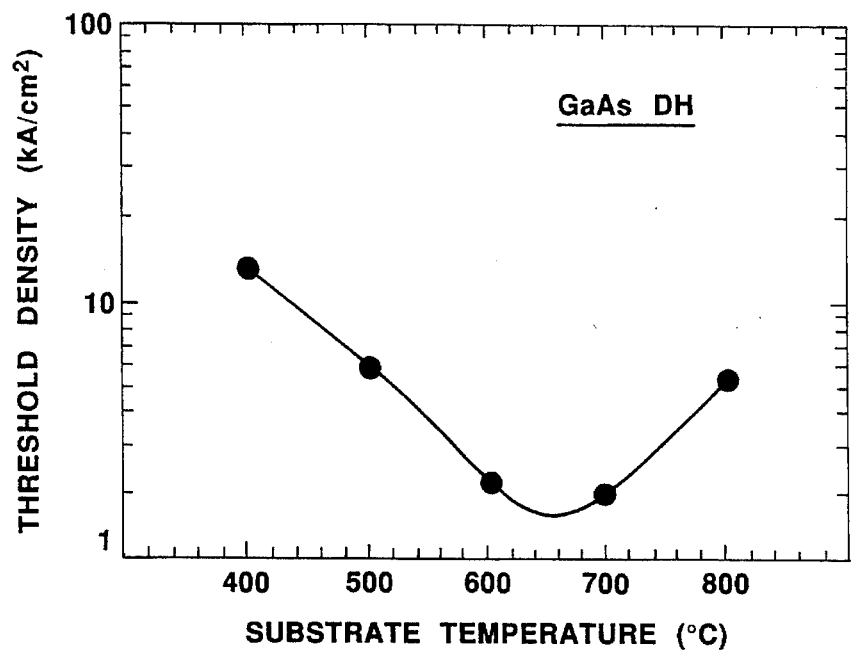
FIG. 2 illustrates a graph for showing the substrate temperature dependency of threshold current density of a prior art example of a semiconductor laser.
Figure 3:
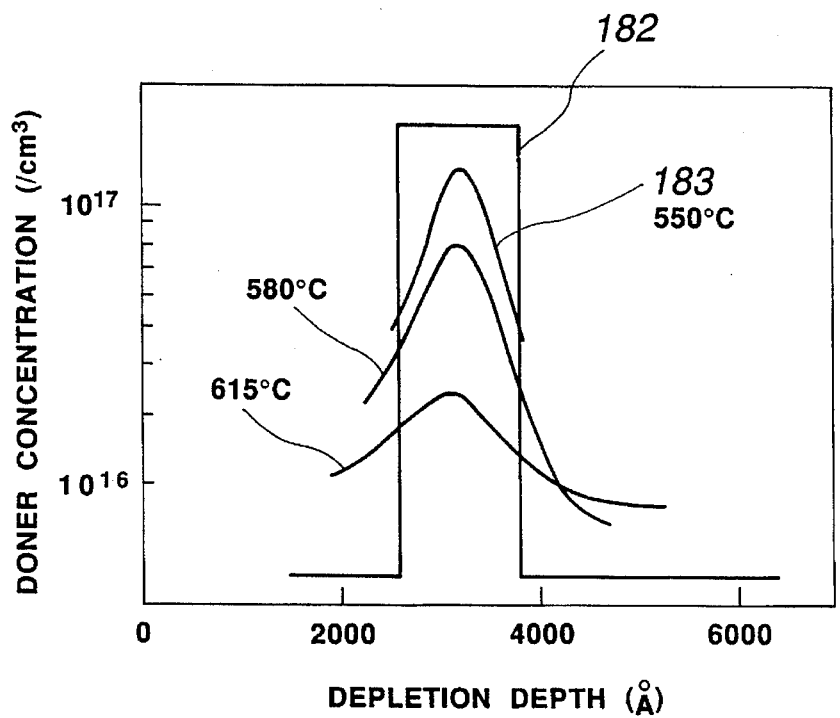
FIG. 3 illustrates a graph for showing the manner of diffusion in a prior art example of Sn-doped GaAs.
Figure 4:
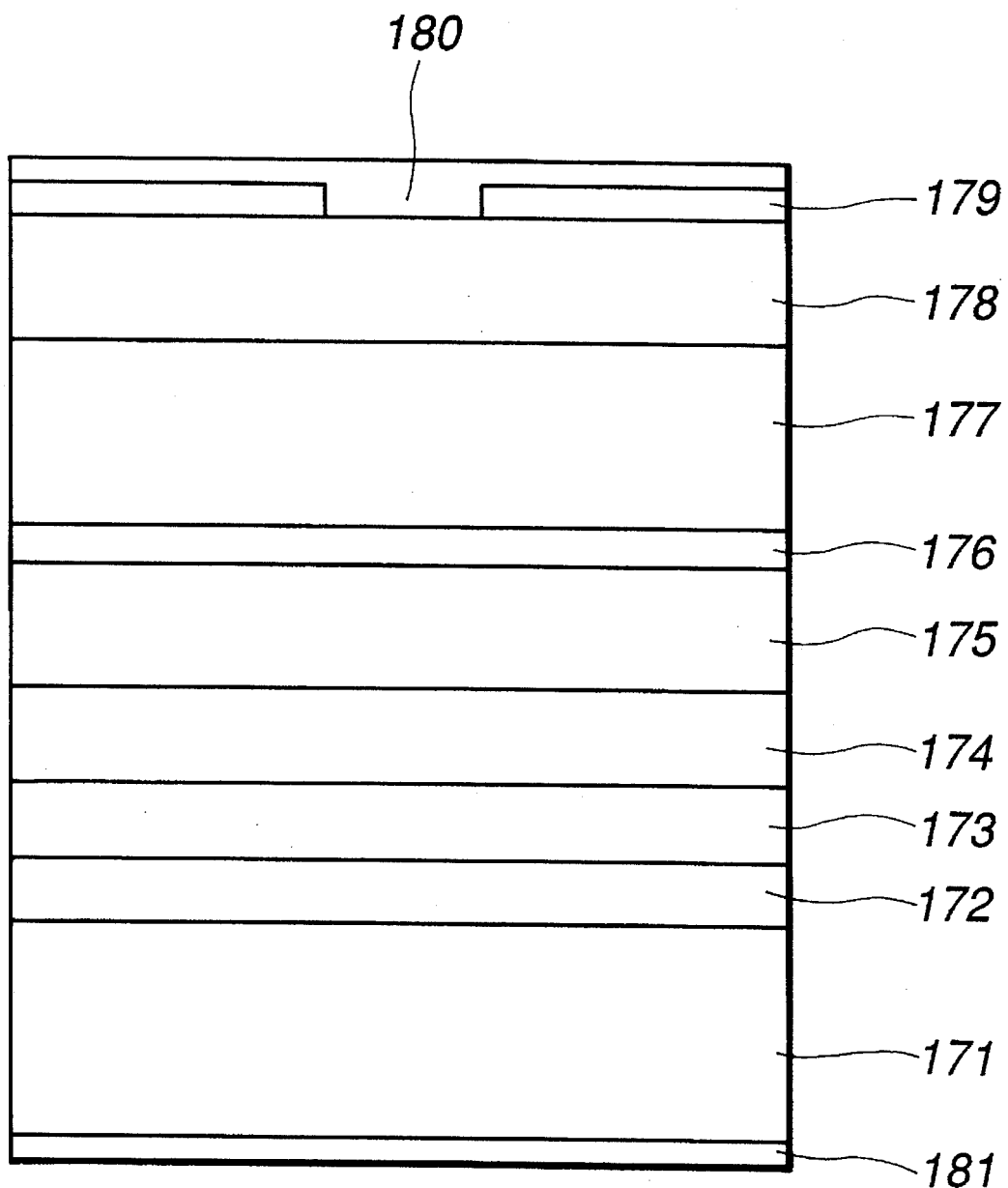
FIG. 4 is a cross-sectional view for explaining a prior art example of a double-hetero junction laser using an Si substrate.
Figure 5A:
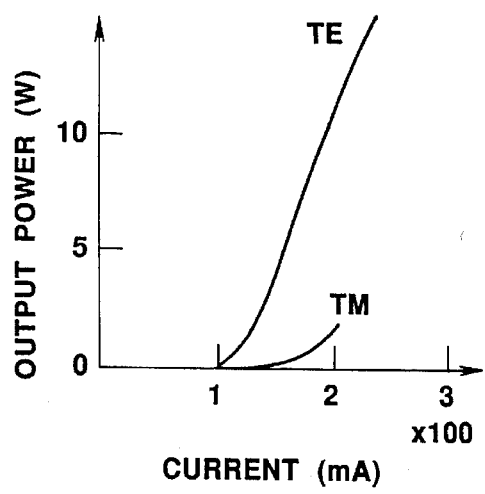
FIGS. 5A and 5B respectively illustrate graphs for explaining characteristics of prior art examples.
Figure 5B:
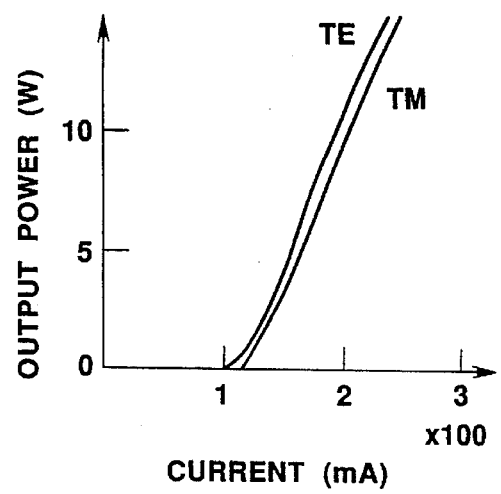
Figure 6:
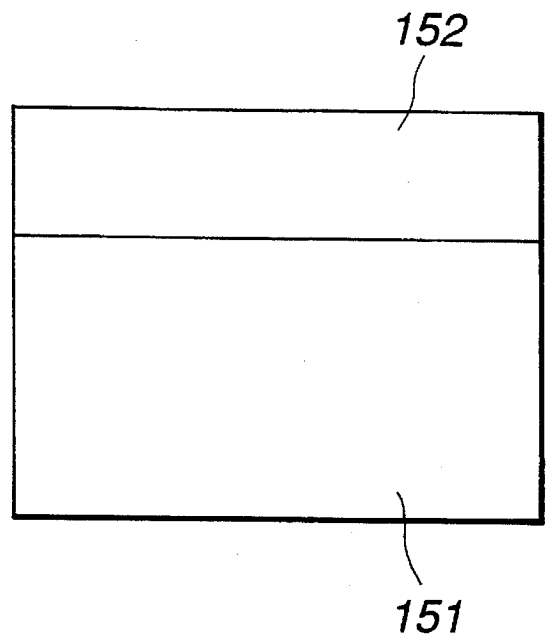
FIG. 6 is a view showing a prior art growth method example in which a ZnSe layer is grown on a GaAs substrate.
Figure 7:
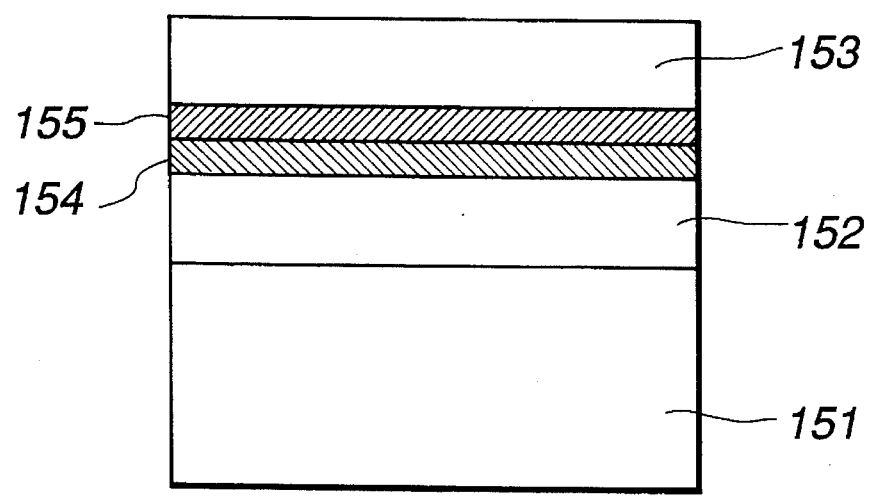
FIG. 7 is a view for explaining the prior art example of FIG. 6.
Figure 9A:
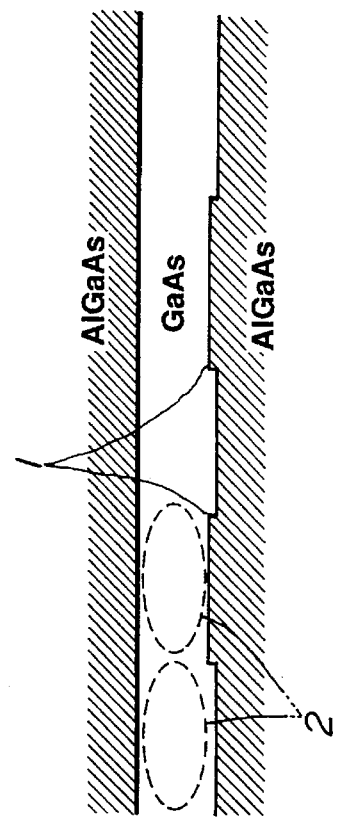
FIGS. 9A and 9B respectively illustrate quantum well structures produced by the first embodiment and a prior art method.
Figure 9B:
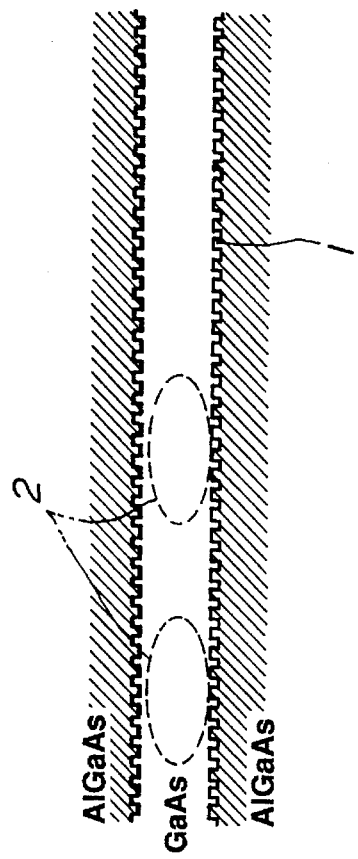

FIG. 8 shows processing steps of III–V group compound semiconductor devices of a first embodiment according to the present invention. Due to these processing steps, the GaAs/AlGaAs quantum well structure having an effectively flat boundary plane is fabricated. In FIG. 9, the structure of quantum well produced by the first embodiment is illustrated in FIG. 9A, compared with a prior art example illustrated in FIG. 9B.

Figure 10:
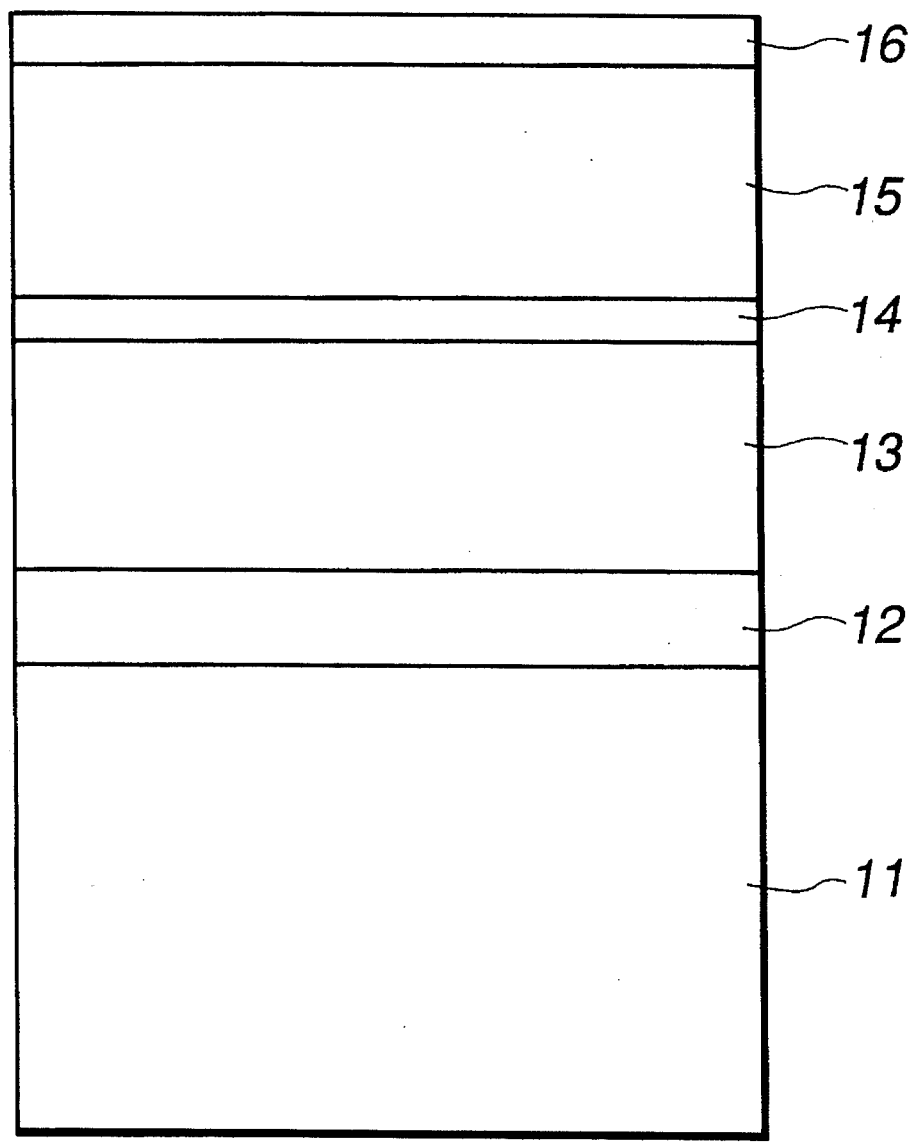
FIG. 10 is a cross-sectional view of a semiconductor laser produced by the first embodiment.

As shown in FIG. 10, on an n-type GaAs substrate 11, a buffer Layer 12 of undoped GaAs having a thickness of 0.5 μm, a barrier layer 13 of undoped $Al_{0.3}Ga_{0.7}As$ having a thickness of 1.5 μm, and a quantum well layer 14 of undoped GaAs having a thickness of 8nm are formed in the named order. Further, on the quantum well layer 14, a barrier layer 15 of undoped $Al_{0.3}Ga_{0.7}As$ having a thickness of 1.5 μm and a cap layer 16 of undoped GaAs having a thickness of 0.2 μm are formed.

In the first embodiment, when the substrate temperature in MBE method is set to 400° C. and a flux ratio y of V / III group (a value of the incoming molecular number of V group having a high vapor pressure divided by the incoming molecular number of III group having a low vapor pressure) is set to γ=1.1 for the $Al_{0.3}Ga_{0.7}As$ layer, the flux ratio γ is equal to 1.57 for the GaAs quantum well layer 14 (see the first step or step 1 in FIG. 8). The thus fabricated quantum well 14 is excited by an Ar laser having an oscillation wavelength of 514.5 nm, and photoluminescence at a temperature of 77 K is measured. Then, its half width is 3.5 meV that is lower than heat energy (6.6 meV), and it can be seen therefrom that an effectively flat boundary plane is formed as shown by the islands 1 having a difference of one atomic layer and the excitons 2 in FIG. 9A. When the radiation intensity is compared with what is grown at high substrate temperatures (e.g., 625° C.), the intensity turns out to be about one eighth of the latter, and it can be shown that there exist a number of non-radiation recombination centers due to the growth at low temperatures.

Then, heat-treatment at 700° C. in a hydrogen flow at one atmospheric pressure is performed for 0.5 hour (see the second step or step 2 in FIG. 8). As a result, the crystal defects are annealed and the non-radiation recombination centers decrease. Namely, the radiation intensity becomes eight times as large and approximately equal to that of a high-temperature growth. At this time, steepness at the quantum well boundary plane is maintained and the half width of photoluminescence remains unchanged.

In this embodiment, in order to adjust the As pressure at the time of heat treatment, the GaAs wafer is used as the other As source and the disposition of face to face is utilized. A cap material, however, is not needed. Further, heat treatment may be conducted in a state in which no other As source is used and no cap is used.

A second embodiment of the present invention will be described.

Figure 12:
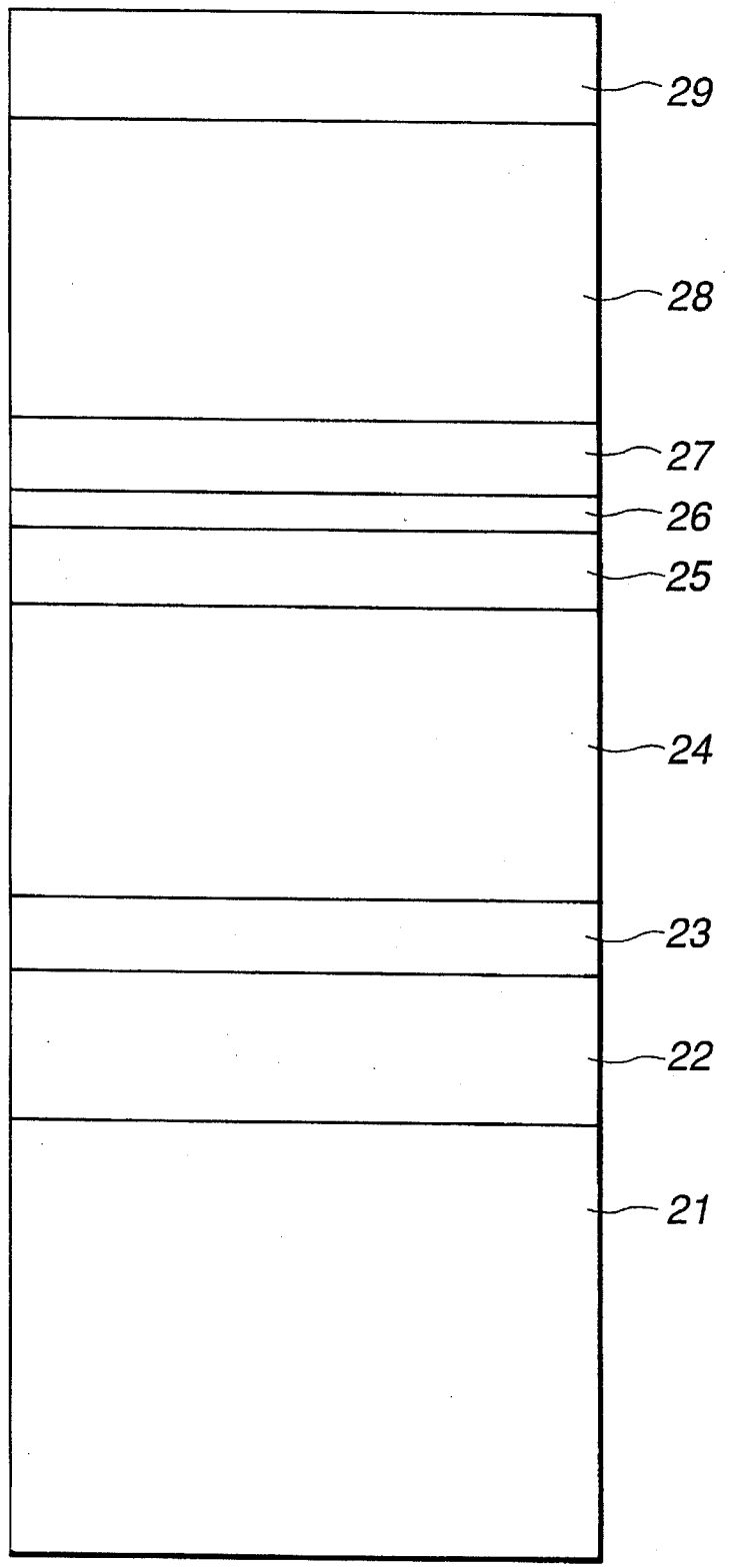
FIG. 12 is a cross-sectional view of a semiconductor laser produced by the second embodiment.

FIG. 11 shows producing steps of semiconductor laser devices (GRIN-SCH-SQW laser diode) having a flat quantum well of a second embodiment according to the present invention. FIG. 12 illustrates the structure of a semiconductor laser fabricated by the second embodiment.

As shown in FIG. 12, on an n-type GaAs substrate 21, a buffer layer 22 of Si-doped GaAs having a thickness of 0.5 μm, a multiple quantum well (MQW) buffer layer 23 that consists of ten pairs of Si-doped GaAs layers (its thickness is 10nm) and Si-doped $Al_{0.5}Ga_{0.5}As$ layers (its thickness is 4nm) and a cladding layer 24 of Si-doped $Al_{0.5}Ga_{0.5}As$ having a thickness of 1.5 μm are formed in the named order. Further, on the cladding layer 24, an optical confinement region 25 of Si-doped $Al_yGa_{1-y}As$ having a thickness of 2000 Å, and its Al mole fraction y gradually changes from 0.5 to 0.3 toward an active layer 26.

The active layer 26 of single quantum well (SQW) consists of a barrier layer of undoped $Al_{0.3}Ga_{0.7}As$ having a thickness of 10 nm, a well layer of undoped GaAs having a thickness of 6 nm and a barrier layer of undoped $Al_{0.3}Ga_{0.7}As$ having a thickness of 10 nm. On the single quantum well 26, an upper optical confinement region 27 of Be-doped $Al_zGa_{1-z}As$ having a thickness of 2000 Å is formed. Its Al mole fraction z is also gradually changed from 0.3 to 0.5, in contrast to the change in Al mole fraction of the lower optical confinement layer 25. Further, on the upper optical confinement layer 27, a cladding layer 28 of Be-doped $Al_{0.5}Ga_{0.5}As$ having a thickness of 1.5 μm and a cap layer 29 of Be-doped GaAs having a thickness of 0.5 μm are formed.

In the second embodiment, the substrate temperature in the MBE method is initially set to 425° C., and the flux ratio γ of V / III group is set to γ=1.1 for the $Al_{0.5}Ga_{0.5}As$ layer to grow the layers (see the first step or step 1 in FIG. 11). Then, the V / III group flux ratio at the time when the active layer 26 of GaAs is grown is equal to 2.2. After that the fabricated laser wafer is disposed in a hydrogen flow at one atmospheric pressure, and the heat treatment at 700° C. is conducted for one hour (see the second step or step 2 in FIG. 11). As a result, crystal defects are corrected, and its result appears in the change in a radiation threshold current density of the laser. For example, in a broad area stripe laser having a width of 100 μm and a resonator length of 400 μm, the radiation threshold current density prior to the heat treatment exhibits 1.5 kA/cm$^2$, while this radiation threshold current density shows 0.53 kA/cm$^2$ after the heat treatment.

The fact whether doping is performed to respective layers or not does not influence the process and effect of this embodiment.

Figure 13:
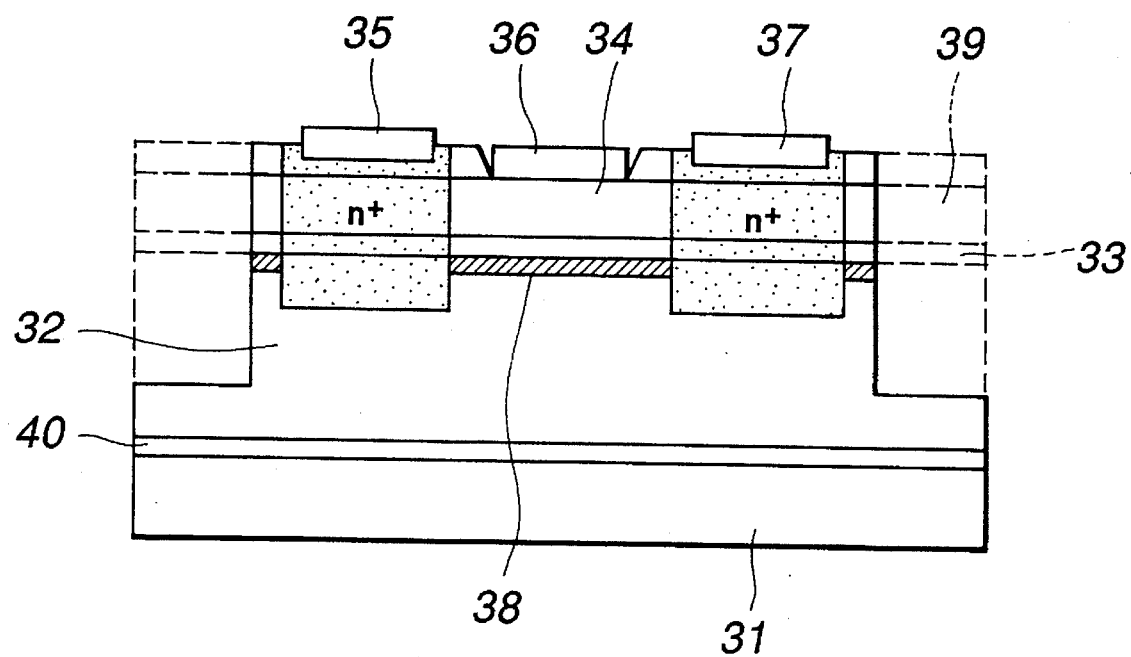
FIG. 13 is a cross-sectional view showing a HEMT structure produced by a third-embodiment of the present invention.

A third embodiment will be described with reference to FIG. 13. FIG. 13 shows the structure of a high electron mobility transistor (HEMT) fabricated by the third embodiment.

In FIG. 13, reference numeral 31 designates a semi-insulating GaAs substrate, reference numeral 32 designates an active region of undoped GaAs having a thickness of 1 μm, reference numeral 33 designates a spacer layer of $Al_xGa_{1-x}As$ having a thickness of 100 Å, reference numeral 34 designates an Si-doped $Al_xGa_{1-x}As$ layer having a thickness of 1 μm, reference numeral 35 designates a source, reference numeral 36 designates a gate, reference numeral 37 designates a drain, reference numeral 39 designates an isolation area, and a reference numeral 40 designates a buffer layer of undoped GaAs formed on the substrate 31. In this embodiment. Al mole fractions of the layers 33 and 34 are respectively x=0.25. Further, reference numeral 38 designates a two-dimensional electron gas (2 DEG).

The feature of the method for producing the device having the above structure is that the flux ratio γ at the time of layer growth is maintained below 2.0, and As$_4$ (a molecular configuration containing four atoms) pressure is 1×10$^{-5}$ Torr. Thus, the flux ratio γ of V / III group is 1.4 for AlGaAs, and 1.9 for GaAs. As a result, a high-quality compound semiconductor crystal is obtained even when the growth is performed at low temperatures. In particular, the 2 DEG 38 exists in the vicinity of the boundary plane between the active layer 32 of undoped highly pure GaAs and the spacer layer 33 of $Al_xGa_{1-x}As$, and this boundary plane can be made effectively flat.

The thus fabricated device is heat-treated at 600° C. in a hydrogen flow at one atmospheric pressure, for one hour. As a result, the carrier mobility is greatly improved.

In the first to third embodiments, AlGaAs series materials are basically used, but the hetero-boundary plane may be made up of a combination of, for example, GaP.AlGaP- .GaInAs. The same effect as above can be obtained even when using those other materials.

Figure 14:
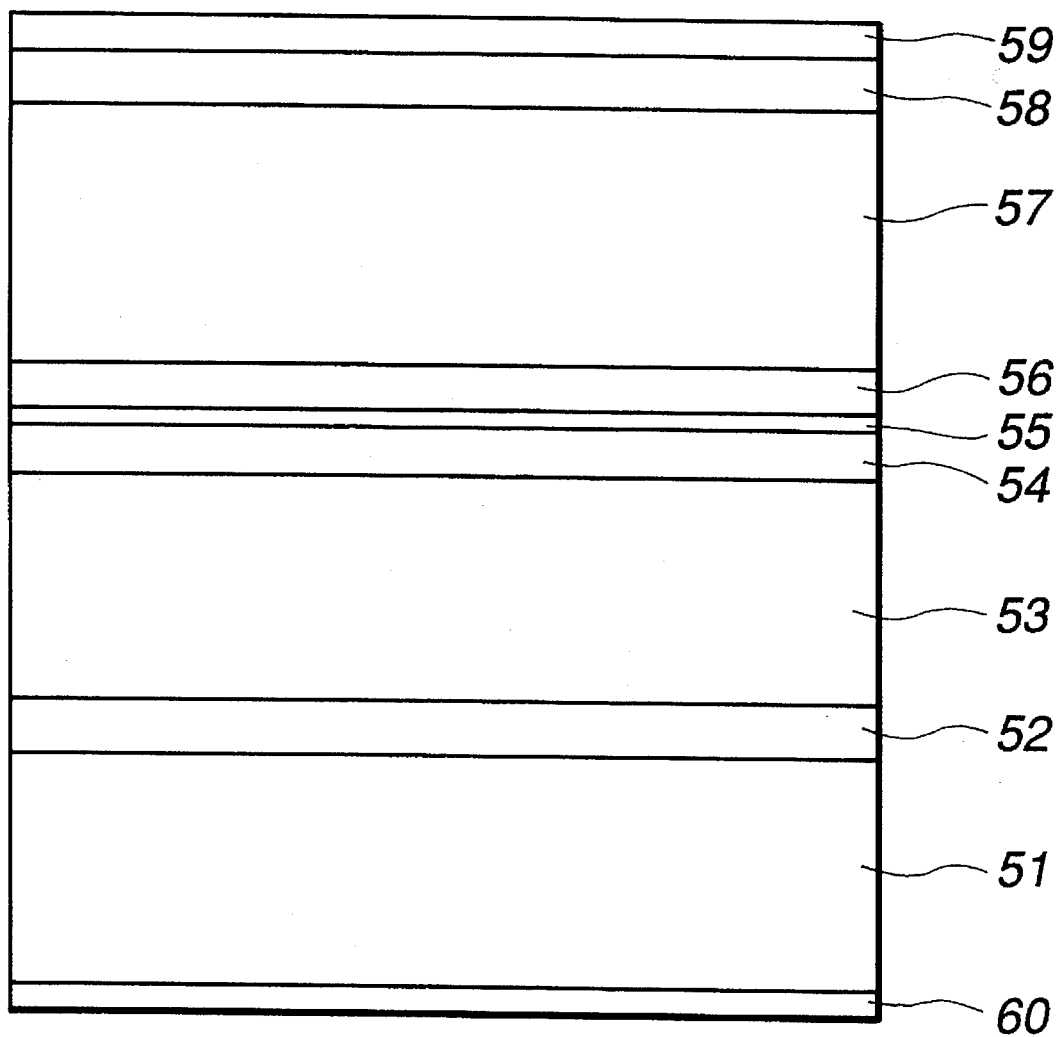
FIG. 14 is a cross-sectional view of a semiconductor laser produced by a fourth embodiment of the present invention.

A fourth embodiment will be explained. FIG. 14 shows a cross-sectional view of a single quantum well (SQW) laser fabricated by the fourth embodiment of a crystallinity improvement method of the present invention.

As shown in FIG. 14, on an n-type GaAs substrate 51, a buffer layer 52 of Si-doped GaAs and a Si-doped $Al_{o.5}Ga_{o.5}As$ layer 53 having a thickness of 1.5 µm are formed in this order. Further, on the buffer layer 52, a lower optical confinement layer 54, an active layer 55, an upper optical confinement layer 56, Be-doped $Al_{o.5}Ga_{o.5}As$ layer 57 and a cap layer 58 are formed in this order.

The lower optical confinement region 54 consists of undoped $Al_yGa_{1-y}As$ having a thickness of 2000 Å, the Al mole fraction y is gradually changed from 0.5 to 0.3 toward the active layer 55. The active layer 55 consists of undoped GaAs having a thickness of 70 Å, the upper optical confinement region 56 having a thickness of 2000 Å consists of undoped $Al_zGa_{1-z}As$, and its Al mole fraction z gradually increases from 0.3 to 0.5, symmetrically to the lower optical confinement layer 54. The layer 57 has a thickness of 1.5 µm, and the cap layer 58 consists of Be-doped GaAs having a thickness of 0.5 µm.

After the respective layers are grown, the substrate 51 is thinned to approx. 100 µm, and a p-side electrode 59 of Cr/Au and an n-side electrode 68 of AuGe/Ni/Au are formed. Thus, the SQW laser having a ridge type waveguide is completed.

Figure 15:
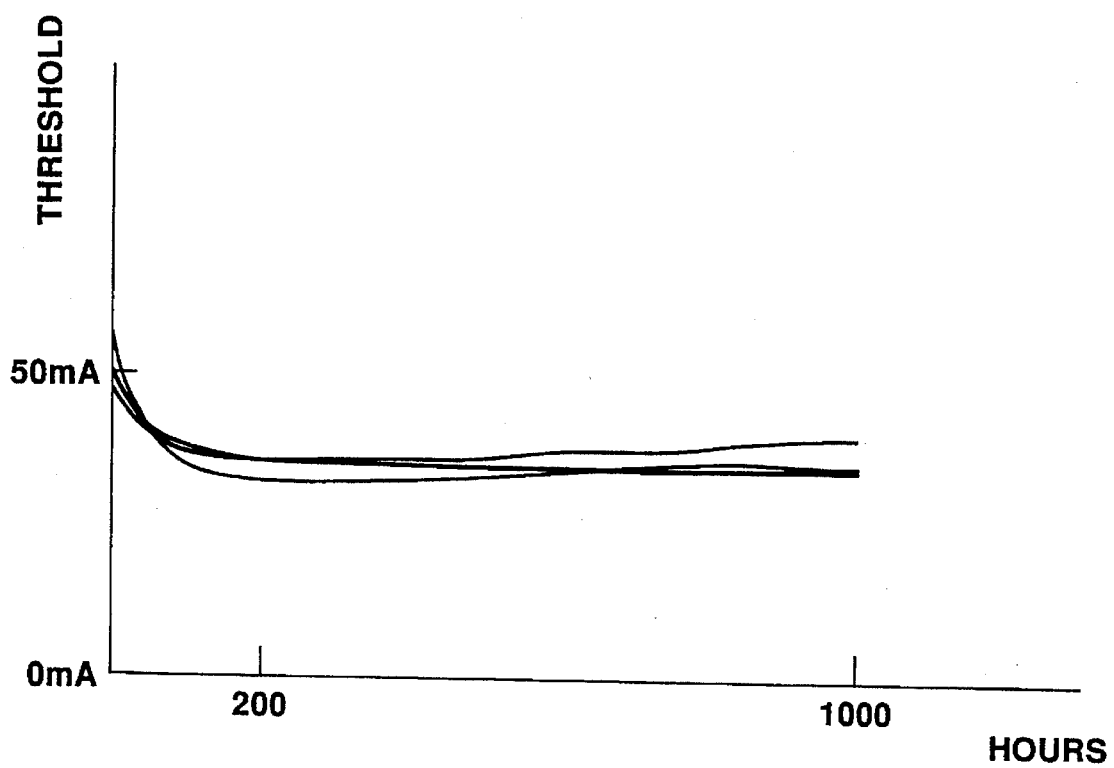
FIG. 15 illustrates a graph for showing the change of a threshold current density with time.

A current is caused to flow into the thus fabricated SQW laser at an atmospheric temperature of 70° C. FIG. 15 illustrates the change with time in the threshold current density due to that current flow treatment. In FIG. 15, the abscissa indicates a current flow treatment period and the ordinate indicates a threshold current (mA) of the SQW laser. As is shown in FIG. 15, the threshold current decreases as the current flow period increases, and there is a tendency of saturation after a predetermined time. As a result of the current flow treatment, the threshold current of SQW laser is reduced two thirds, compared with the laser not subjected to the current flow treatment. According to the condition, there may be a case where the threshold of SQW laser becomes a half. When the threshold current value becomes stable and constant, the value is kept unchanged thereafter as shown in FIG. 15.

The current flow treatment of SQW laser is desirably conducted under the condition that the laser is not oscillated, as much as possible. This is because there is a possibility that the end surface of the laser will be degraded by laser light if the laser oscillation should occur. Further, this is because the crystallinity improvement depends highly on the amount of current flow treatment and its ambient temperature, irrespective of light output of the laser.

Figure 16A:
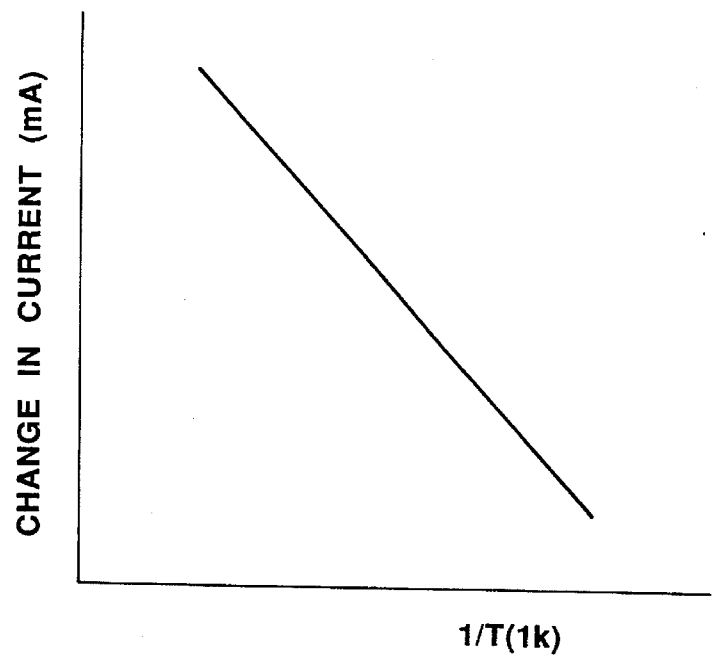
FIGS. 16A and 16B respectively illustrate graphs for explaining ambient temperature-current change amount characteristics and current flow amount-current change amount characteristics.
Figure 16B:
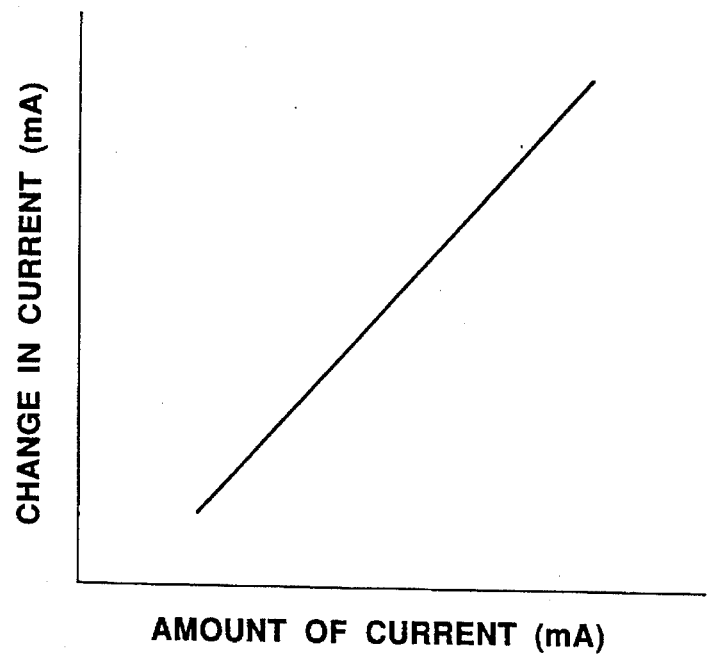

An example will be explained that explicates the dependency of the crystallinity improvement on the amount of current flow treatment and ambient temperature. FIG. 16A shows a relationship between the ambient temperature and the change in threshold current when the amount of supplied current of the current flow treatment is constant, and FIG. 16B shows a relationship between the amount of supplied current of the current flow treatment and the change in threshold current when the ambient temperature is constant. As is seen from FIG. 16. the decrease in threshold current becomes large as the ambient temperature is raised, and the improvement speed increases as the amount of supplied current of the current flow treatment increases. When the current flow treatment is conducted at the same level, the improvement is greater and the degradation of the devices end surface is less as the ambient temperature increases under the condition that no laser oscillation is conducted.

Figure 17:
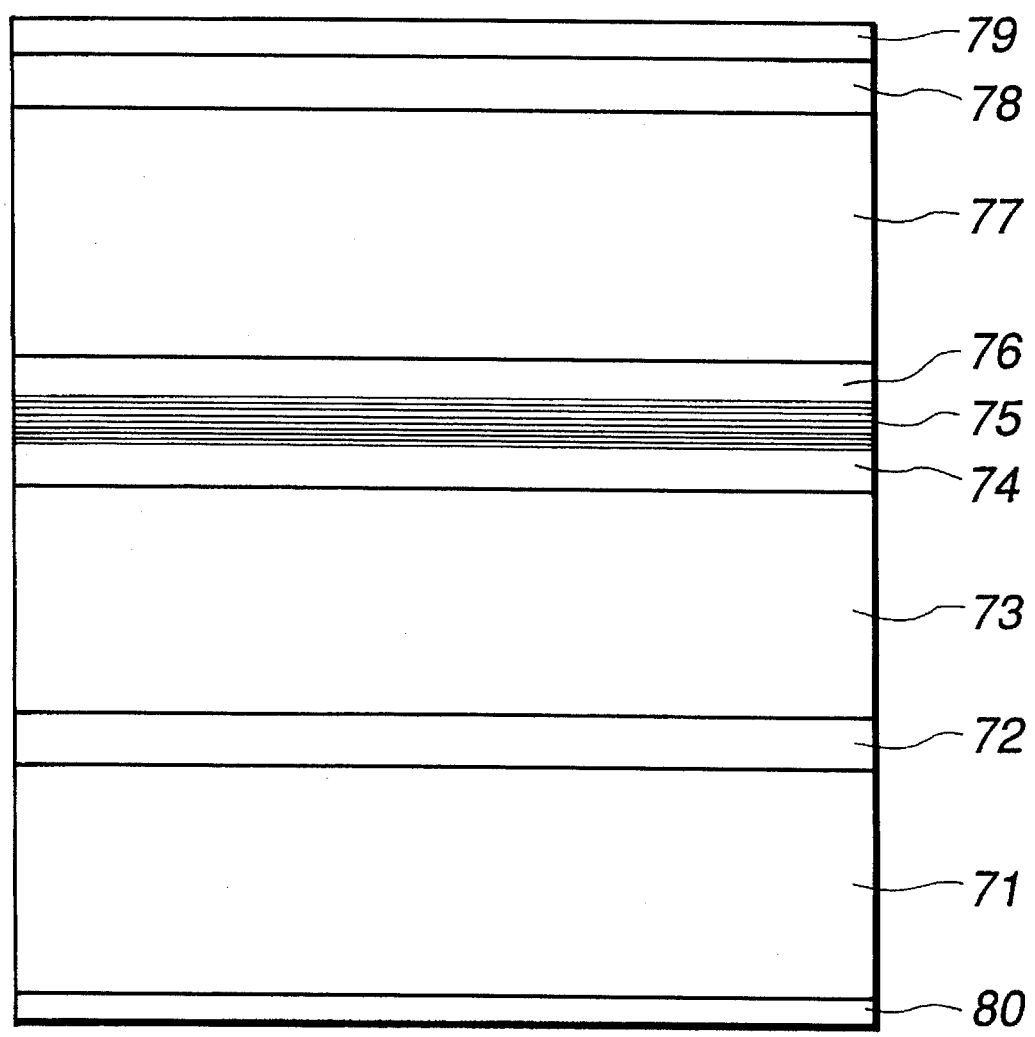
FIG. 17 is a cross-sectional view of a semiconductor laser produced by a fifth embodiment of the present invention.

A fifth embodiment will be explained. FIG. 17 shows a cross-sectional view of a semiconductor laser having an active layer of multiple quantum well (MQW) structure.

In FIG. 17, reference numeral 71 designates a p-type GaAs substrate having a thickness of 0.5 µm, reference numeral 72 designates a buffer layer of Be-doped GaAs having a thickness of 0.5 µm, reference numeral 73 designates a cladding layer of Be-doped $Al_{o.5}Ga_{o.5}As$ having a thickness of 1.5 µm, reference numeral 74 designates an optical confinement layer of Be-doped $Al_xGa_{1-x}As$, having a thickness of 200nm, reference numeral 75 designates an active layer of five-layer structure of undoped GaAs and $Al_{o.3}Ga_{o.7}As$. On the active layer 75, an upper optical confinement layer 76, a Si-doped $Al_{o.5}Ga_{o.5}As$ layer 77, and a cap layer 78 are layered in this order. The Al mole fraction of the optical confinement layer 74 is 0.5 at its boundary plane with the cladding layer 73, and gradually decreases to 0.3 toward its boundary plane with the active layer 75.

In the active layer 75, an undoped GaAs layer is initially formed to a thickness of 6nm, an undoped $Al_{o.3}Ga_{o.7}As$ is formed thereon to a thickness of 10nm, and then five-pairs of undoped GaAs layers and undoped $Al_{o.3}Ga_{o.7}As$ layers are layered. Thus, the active layer 75 is fabricated.

Further, in FIG. 17, reference numeral 76 designates the upper optical confinement layer 76 of Si-doped $Al_xGa_{1-x}As$, having a thickness of 200 nm, reference numeral designates the cladding layer of Si-doped $Al_{o.5}Ga_{o.5}As$ having a thickness of 1.5 µm, and reference numeral 78 designates the cap or contact layer of Si-doped GaAs having a thickness of 0.5 µm. The Al mole fraction of the cladding layer 77 is 0.3 at its boundary plane with the active layer 75, and gradually increases to 0.5 toward its boundary plane with the upper cladding layer 77. Further, reference numeral 79 designates an n-side electrode of AuGe/Au, and reference numeral 80 designates a D-side electrode of Cr/Au.

The crystallinity of MQW laser having the above-discussed structure is effectively improved by the current flow treatment. For example, the threshold of the MQW laser is reduced approx. two thirds by the current flow treatment that is performed for about 10 hours at the ambient temperature of 70° C. Furthermore, the same effect is obtained in a normal double-hereto (DH) structure in which the thickness of an active layer is approx. 0.1 µm. Thus, it has been clearly demonstrated that the crystallinity improvement of a semiconductor laser whose growth temperature is low can be achieved by the current flow treatment.

Further, the crystallization improvement method can be applied to the fabrication of a low-temperature growth light emitting diode. In fields of optical communications and so forth, the integration of semiconductor devices is a key technology for achieving a high-speed communication. In the integration process of semiconductor devices, the low-temperature growth technology is important, and all processes can be conducted at low temperatures below 500° C. by combining the low-temperature growth method and the crystallization improvement method of this embodiment. Further, optimum conditions make it possible to conduct all processes at low temperatures of approx. 350° C.

A laser of AlGaAs series can be fabricated on a Si substrate by using the low-temperature growth technology and the crystallization improvement method with current flow treatment. An example thereof will be described hereinbelow.

Figure 18:
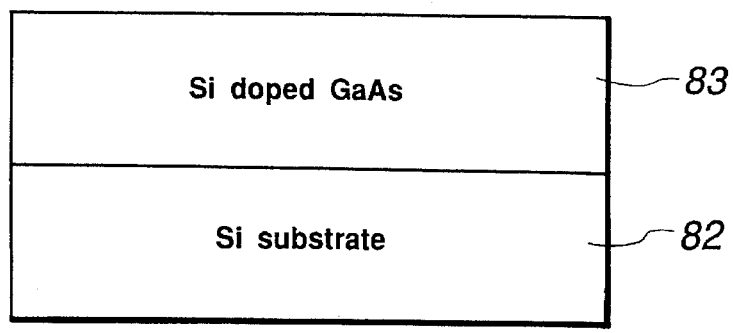
FIG. 18 illustrates a view for explaining a growth method of Si-doped GaAs.

FIG. 18 explains a growth method in which a Si-doped GaAs layer 83 is grown on a Si substrate 82 at a substrate temperature of 350° C. The defect density of the Si-doped GaAs layer 83 is $1 \times 10^5$ cm$^{-2}$. Improvement of more than two orders can be obtained, compared with prior art, and this improvement is attributable to mitigation of stress due to differences in thermal expansion coefficient and so on.

Figure 19:
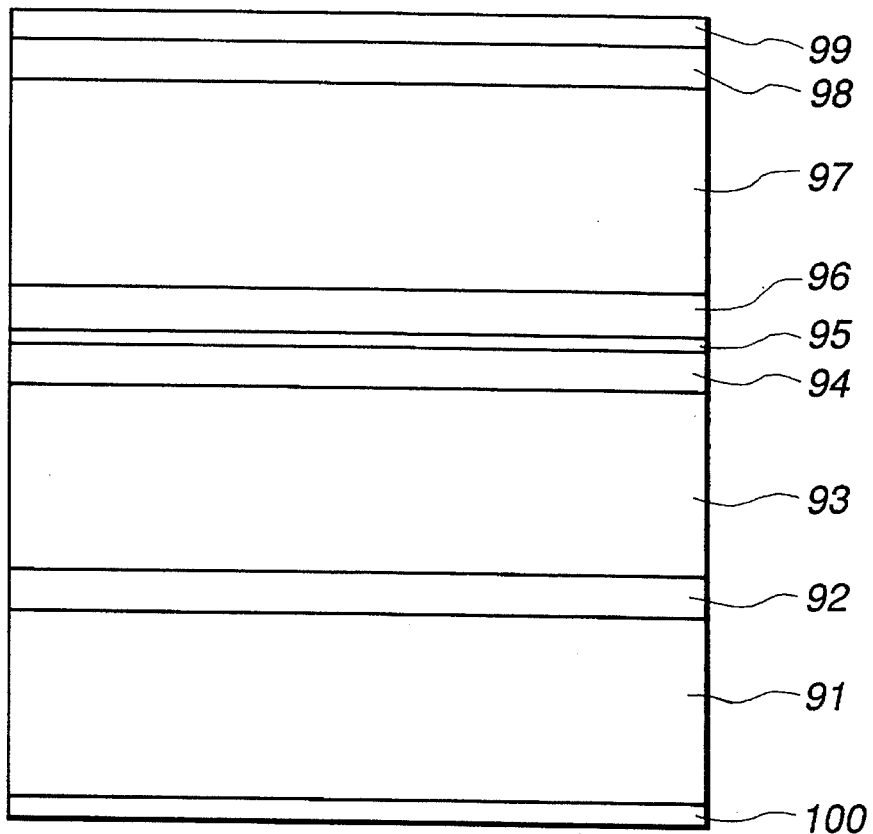
FIG. 19 is a cross-sectional view of a semiconductor laser produced by a sixth embodiment of the present invention.
Figure 20:
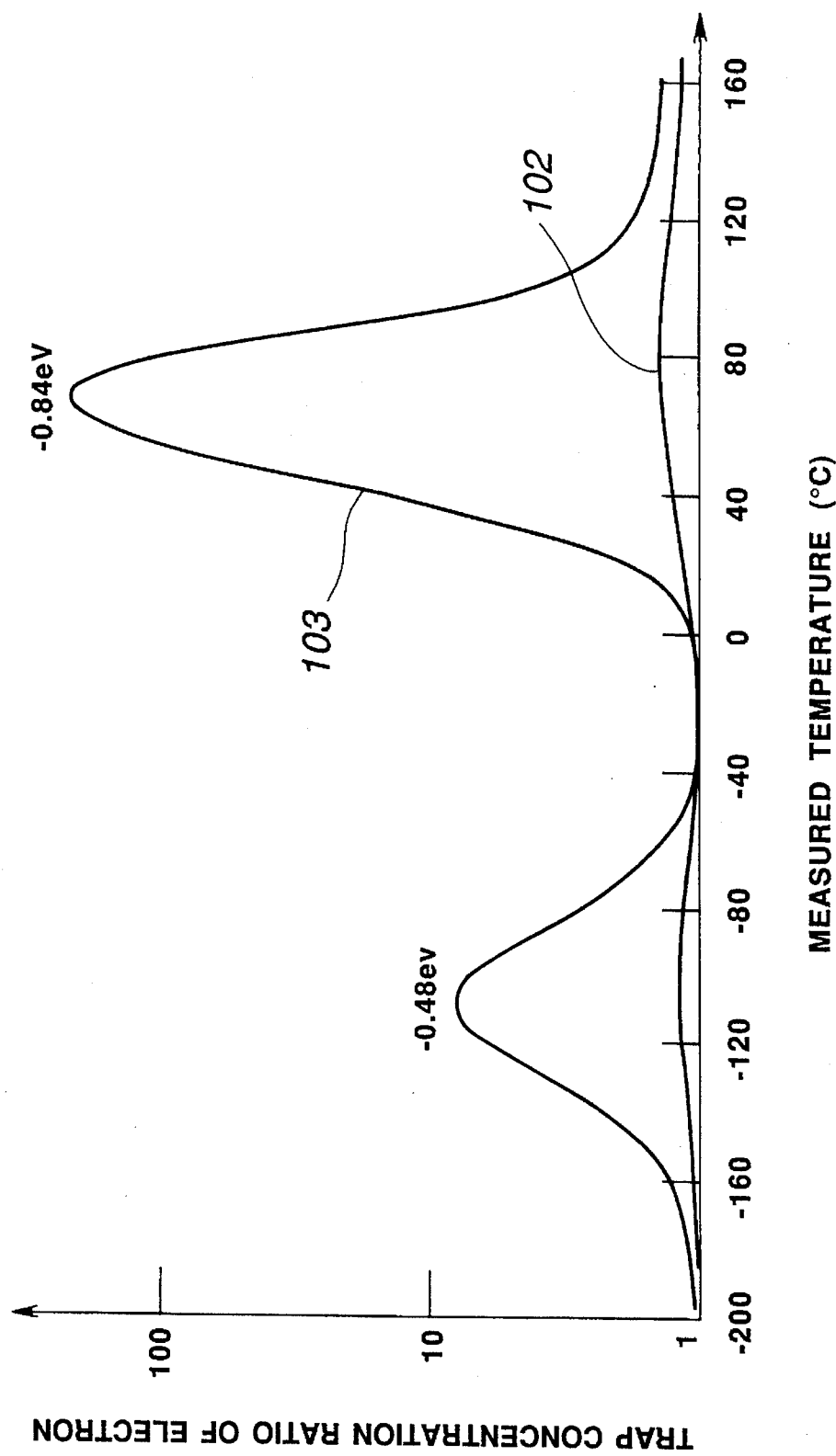
FIG. 20 illustrates a graph for showing the effect of inactivation of Deep Levels achieved by the present invention, which is measured by the DLTS method.

FIG. 19 is a cross-sectional view of a semiconductor laser of a sixth embodiment. The stress mitigation method is used for fabricating the semiconductor laser. The semiconductor laser structure is formed on a Si substrate, and the Al mole fraction of the cladding layer is 0.5.

In FIG. 19, reference numeral 91 designates a (001) plane n-type Si substrate, reference numeral 92 designates a Si-doped GaAs layer having a thickness of 0.5 µm, reference numeral 93 designates a Si-doped $Al_{o.5}Ga_{o.5}As$ layer having a thickness of 2.0 µm, reference numeral 94 designates an optical confinement layer of Si-doped $Al_xGa_{1-x}As$ having a thickness of 500 Å (x is changed from 0.5 to 0.3), reference numeral 95 designates an undoped GaAs active layer having a thickness of 70 Å, reference numeral 96 designates an upper optical confinement layer of Be-doped $Al_yGa_{1-y}As$ having a thickness of 500Å (y is changed from 0.3 to 0.5). reference numeral 97 designates an upper cladding layer of Be-doped $Al_{o.5}Ga_{o.5}As$ having a thickness of 1.5 µm, reference numeral 98 designates a cap layer of Be-doped GaAs reference numeral 99 designates a p-type electrode and a reference numeral 100 designates an n-type electrode.

The MBE method is adopted as a growth method, and conditions are set so that the growth speed of GaAs layer 95 is 0.7 µm/hour, that the substrate temperature is 350° C. and that the rotation speed of substrate 100 is 12 rpm. A pressure is controlled so that flux ratios for the respective layers are maintained below 2. As a result, the threshold current density turns out to be 2 kA/cm$^2$ Further, when the current flow treatment is performed for approx. 10 hours at the ambient temperature of 60° C. the threshold current is improved to be 1kA/cm$^2$.

Thus, even when GaAs is grown on the Si substrate, a high quality layer can be produced even at low temperatures by utilizing the current flow treatment.

In such a case where the Si substrate is used, an MQW structure, and GaAs having a thickness of about 0.1 µm and having no quantum effect other than the above-mentioned SQW structure, may also be used as an active layer.

Although the MBE method is used in the above-discussed embodiments, a layer or layers of the semiconductor device may be formed by the MEE (Migration Enhanced Epitaxy) method.

In the MBE method, materials are supplied continuously, while in the MEE method, Ga, Al, As and the like are independently supplied alternately, or alternately with each being of the groups III and V unit. In the MEE method, the process is performed at low temperatures throughout, so that AlGaAs, GaAs and the like having a high quality (highly crystallized) can be obtained. But, since in the MEE method the materials are alternately supplied, its growth speed is slow. This drawback can be solved by combining the MEE method and the above-discussed growth method at a low flux ratio. Growth methods partially involving the MEE method will be described below.

For example, in the fifth embodiment of FIG. 17, the lower light confinement layer 74 made of undoped $Al_{o.4}Ga_{o.5}As$, MQW layer 75 and upper light confinement layer 76 made of undoped $Al_{o.4}Ga_{o.6}As$ can be grown by the MEE method. Here, Al and Ga are paired, and such pair and As are alternately applied to the substrate. The composition ratio or mole fraction is determined by respective flux amounts. In this example, the threshold current density of 1.5 kA/cm$^2$ is obtained, and this value is improved to 800 A/cm$^2$ by the current flow treatment.

The II / VI group series materials may be used. For example, ZnSe, CdTe and the like are materials required to be grown at low temperatures, and GaAs series and AlGaAs series are degraded in crystal quality when grown at low temperatures. Those materials, however, can be improved in crystal quality by using the current flow treatment. Namely, low-temperature growth materials such as ZnSe and III / V group compound semiconductor series such as GaAs can be compounded by means of the crystallinity improvement method using the current flow treatment.

As described in the above-discussed embodiments, the substrate temperature is set below 500° C. when the compound semiconductor hereto boundary plane or interface is grown, so that the diameter of an island having a step difference of one atomic layer is reduced. Therefore, an effectively flat boundary plane can be formed for excitons in quantum wells or carriers in the vicinity of the boundary planes, and crystal defects due to the low-temperature growth can be corrected by the following heat treatment. Thus, semiconductor devices that excel in crystallinity or crystallization and interface flatness can be produced.

Further, crystal layers can be fabricated at low temperatures and the crystallinity thereof can be improved by the current flow treatment of the grown crystal layers. Therefore, all processes of the semiconductor devices can be performed at low temperatures, and the compounding with low-temperature materials such as ZnSe and CdTe and lthe crystal growth of strain material series such as GaAs formed on Si substrate can be achieved.

A seventh embodiment of the present invention will be described with reference to FIG. 21.

Figure 21:
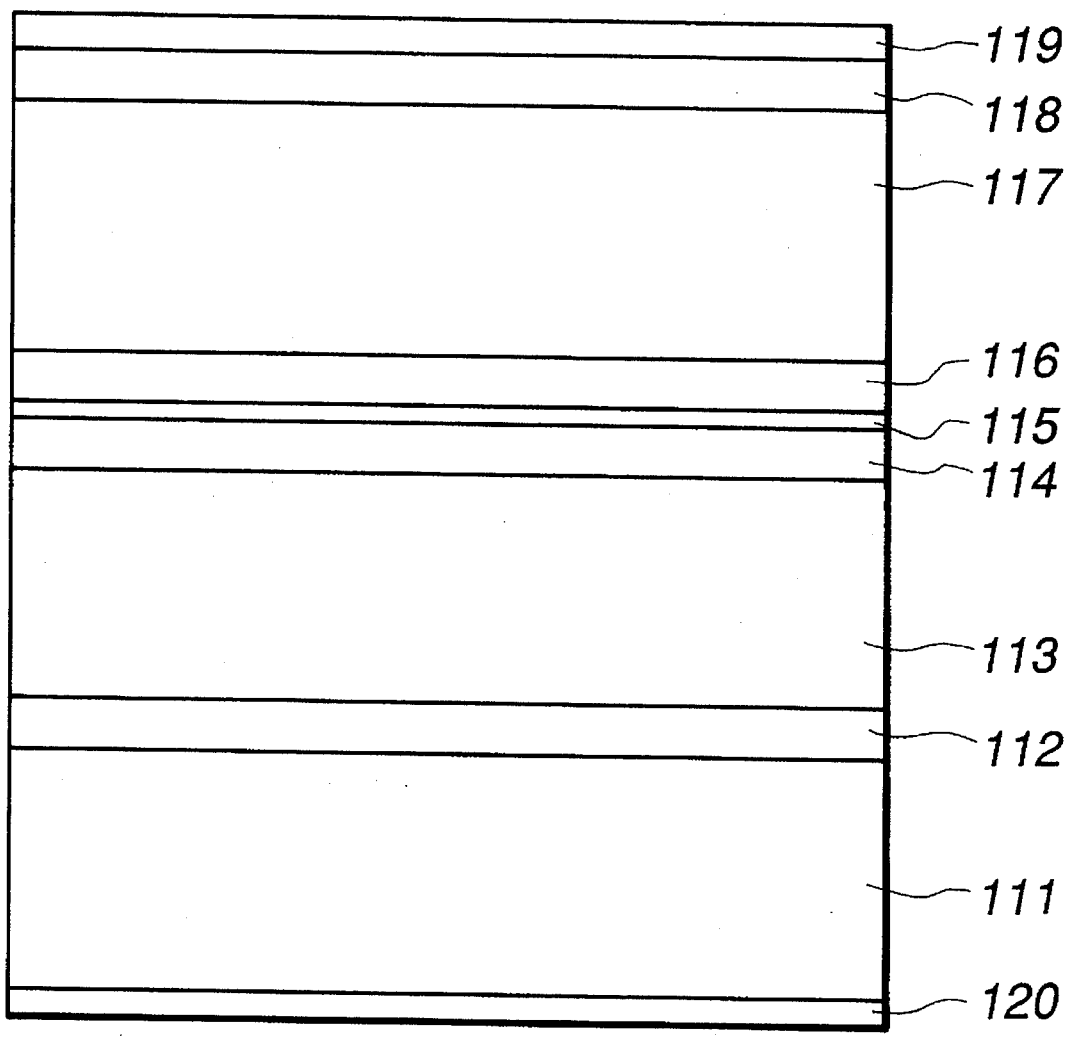
FIG. 21 is a cross-sectional view of a semiconductor laser produced by a seventh embodiment of the present invention.

FIG. 21 shows a cross section of an SQW laser. In FIG. 21, on an n-type GaAs substrate 111, a buffer layer 112 of Si-doped GaAs having a thickness of 0.5µm, and a Si-doped $Al_{o.5}Ga_{o.5}As$ layer 113 having a thickness of 1.5 µm are formed in the named order. Further, reference numeral 114 designates an optical confinement region of undoped $Al_yGa_{1-y}As$ having a thickness of 2000 Å, and the Al mole fraction y gradually changes from 0.5 to 0.3 toward the active layer 115.

The active layer 115 consists of undoped GaAs having a thickness of 70 Å. On the active layer 115, an upper optical confinement layer 116 of undoped $Al_zGa_{1-z}As$ having a thickness of 2000 Å is formed. The Al mole fraction z is also gradually changed from 0.3 to 0.5, in contrast to the change of the lower optical confinement layer 114. Further, on the upper optical confinement layer 116, a Be-doped $Al_{o.5}Ga_{o.5}As$ layer 117 having a thickness of 1.5 µm and a cap layer 118 of Be-doped GaAs having a thickness of 0.5 µm are formed.

The laser thus fabricated at low temperatures (growth temperatures below 500° C.) is subjected to diffusion of atomic hydrogen. The background of a vacuum degree in the diffusion apparatus is below $1\times10^{-9}$ Torr. Hydrogen atoms are generated by ECR (electron cyclotron resonance), and introduction hydrogen pressure is set to $6\times10^{-3}$ Torr for generating plasma. The substrate temperature during the plasma process is 300° C. The plasma irradiation is conducted for three hours. In this case, only hydrogen radicals (neutral excited hydrogen atoms) diffused from the plasma caused by ECR are applied to a sample. In order to prevent the impact due to hydrogen ions, the bottom surface of a stainless steel block to which the sample is mounted is caused to face the ECR plasma room. After that, the substrate 111 is thinned to approx. 100 μm, and an n-type electrode 120 of AuGe/NL/Au and a p-type electrode 119 of Cr/Au are formed. The laser substrate is worked and a semiconductor laser with a ridge type waveguide is fabricated.

Figure 22:
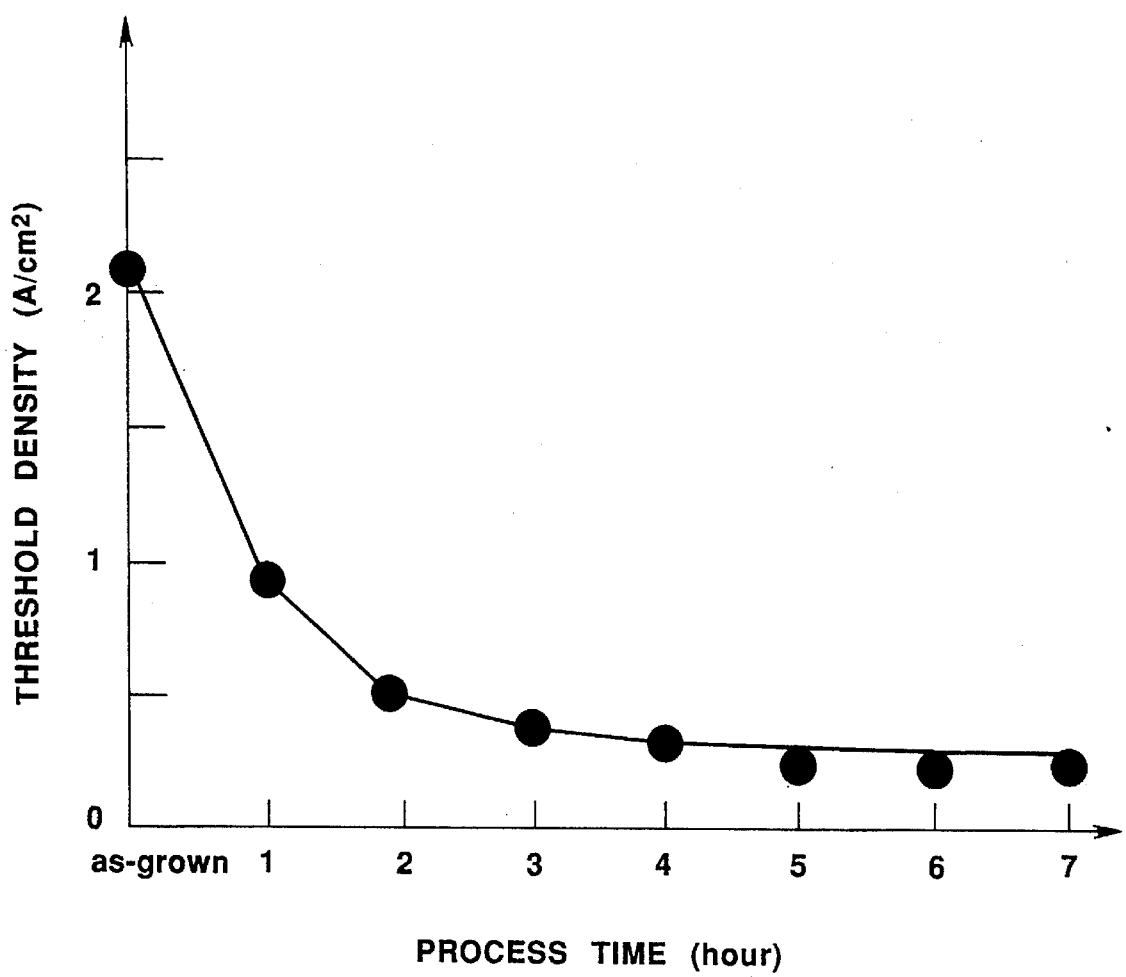
FIG. 22 illustrates a graph for showing the threshold current densities of semiconductor devices subjected to hydrogen plasma processing and not subjected thereto.

The sample subjected to the low-temperature growth step 1 and the plasma process step 2 is compared with the sample subjected only to the low-temperature growth step 1 FIG. 22 shows this comparison The ordinate indicates the threshold current density of the laser, and the abscissa indicates the atomic hydrogen process time or period. A laser whose electrode width is 100 μm and whose cavity length is 500 μm is used, and the measurement is conducted by driving this laser with an input whose pulse width is 500 nsec and whose repeated frequency 1 kHz. While the threshold current density of the laser subjected only to the step 1 is 2 kA,/cm, that of the laser subjected to the plasma process for 3 hours turn out to be as small as 400 A/cm$^2$. It can be seen from FIG. 22 that the threshold current density continues to be improved until the plasma process time of approx. 5 hours, but the improvement of the threshold current density tends to be saturated beyond 5 hours. Thus, all low-temperature process in which crystallinity improvement is achieved by the hydrogen plasma process is realized.

An eighth embodiment will be explained. The structure of a semiconductor laser having an active layer of multiple quantum well (MQW) structure produced by the eighth embodiment is the same as shown in FIG. 17.

The crystallinity of the MQW laser having the above-discussed structure is also effectively improved by the hydrogen plasma process. For example, the threshold current density of the MQW laser is reduced to approx. one third by the hydrogen plasma process performed for about 5 hours at a substrate temperature of 250° C.

Furthermore, the same effect is obtained in a normal double-hereto (DH) structure in which the thickness of an active layer is approx. 0.1 μm. Thus, it has been clearly demonstrated that the crystallinity improvement of all layers in a semiconductor laser whose growth temperature is low can be achieved by the hydrogen plasma process.

Further, this crystallization improvement method can be applied to the fabrication of a low-temperature growth light emitting diode. In fields of optical communications and so forth, the integration of semiconductor devices is a key technology for achieving a high-speed communication. In the integration process of semiconductor devices, the low-temperature growth technology is important, and all processes can be conducted at low temperatures below 500° C. by combining the low-temperature growth method and the crystallization improvement method with this hydrogen plasma process. Further, optimum conditions make it possible to conduct all processes at low temperatures of approx. 300° C.

A laser of AlGaAs series can be fabricated on a Si substrate also by using the low-temperature growth technology and the crystallization improvement method with hydrogen plasma process. An example thereof, i.e., a ninth embodiment of the present invention will be described hereinbelow. The structure thereof is the same as shown in FIGS. 18 and 19.

The hydrogen plasma process is performed for approx. 10 hours at the ambient temperature of 200° C., and hence the threshold is improved to be 300 A/cm$^2$.

Thus, even when GaAs and the like are grown on the Si substrate, a high quality layer can be produced even at low temperatures by utilizing the hydrogen plasma process.

In such a case where the Si substrate is used, an MQW structure, GaAs having a thickness of about 0.1 μm and having no quantum effect other than the above-mentioned SQW may also be used as an active layer.

Although the MBE method is used in the above-discussed embodiments, a layer or layers of the semiconductor device may be formed by the MEE method.

For example, in the eighth embodiment of FIG. 17, the lower light confinement layer 74 made of undoped $Al_{o.4}Ga_{o.6}As$, MQW layer 75 and upper light confinement layer 76 made of undoped $Al_{o.4}Ga_{o.6}As$ can be grown by the MEE method. Here. Al and Ga are paired, and such pair and As are alternately applied to the substrate. The composition ratio or mole fraction is determined by respective flux amounts. In this example, the threshold current density of 1 kA/cm$^2$ is obtained by using the MEE method, and this value is further improved to 400 A/cm$^2$ by the hydrogen plasma process.

The II / V group series materials may also be used in the seventh to ninth embodiment. For example, ZnSe, CdTe and the like are materials required to be grown at low temperatures and GaAs series and AlGaAs series are degraded in crystal quality when grown at low temperatures. Those materials, however, can be improved in crystal quality by using the hydrogen plasma process. Namely, low-temperature growth materials such as ZnSe and III / V group compound semiconductor series such as GaAs can be compounded by means of the crystallinity improvement method using the hydrogen plasma process.

As described in the above-discussed seventh to ninth embodiments, the promotion of inactivation of impurity levels and deep diffusion into semiconductor thin films (the depth of 1 μm) are utilized, and the hydrogen plasma process is performed after the fabrication of devices. All processes can be conducted at low temperatures, which is indispensable for the integration technology, by combining the low-temperature growth technology using the MBE method and the hydrogen plasma process.

Further, according the above seventh to ninth embodiments, crystal layers can be produced at low growth temperatures and thus grown crystal layers can be improved in crystallinity by using the hydrogen plasma process. Therefore, all low-temperature process of semiconductor devices can be realized, and the compounding of low-temperature materials such as ZnSe and CdTe and the AlGaAs series and the like, and a high quality crystal growth of strain material series such as GaAs formed on the Si substrate, can be achieved. Materials are not limited to the above described ones, but the principle can also be applied to materials such as InCaAsP, InAlAs and the like.

While the present invention has been described with respect to what is presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. A method of fabricating a semiconductor laser device, which comprises a substrate and a plurality of semiconductor layers including a laser active layer formed on said substrate, said method comprising the steps of:

growing a compound semiconductor at a substrate temperature not greater than 500° C., by a vacuum deposition, to form the semiconductor layers on the substrate; and causing a current to flow into a semiconductor layer formed on the substrate with the proviso that the semiconductor laser device is not oscillated.

2. A method of fabricating a semiconductor device according to claim 1, wherein the compound semiconductor contains at least III and V group elements.

3. A method of fabricating a semiconductor device according to claim 1, wherein the semiconductor layer is formed under a condition under which a value of the number of incoming molecules of material of group V having a higher vapor pressure divided by the number of incoming molecules of material of group III having a lower vapor pressure is equal to 2.5 or less than 2.5.

4. A method of fabricating a semiconductor device according to claim 1, wherein the current is caused to flow into the semiconductor layer at a temperature not greater than the substrate temperature.

5. A method of fabricating a semiconductor device according to claim 1, wherein the vacuum deposition is a molecular beam epitaph method.

6. A method of fabricating a semiconductor device according to claim 1, wherein the semiconductor layer includes at least As and Ga.

7. A method of fabricating a semiconductor device according to claim 1, wherein the semiconductor layer includes at least Al.

* * * * *

UNITED STATES PATENT AND TRADEMARK OFFICE
CERTIFICATE OF CORRECTION

PATENT NO. : 5,571,748

DATED : November 5, 1996

INVENTORS : SEIICHI MIYAZAWA ET AL.    Page 1 of 3

It is certified that error appears in the above-identified patent and that said Letters Patent is hereby corrected as shown below:

ON TITLE PAGE

[56] References Cited - OTHER PUBLICATIONS under Y. Horikoshi et al., "grown" should read --Growth--;
    "Quantum Wall" should read --Quantum-Well--;
    under H. Sakaki et al, "well" should read --Well--;
    under W.T. Tsang, "$GaAs_xGa_{y-x}As$" should read --$GaAs-Al_xGa_{1-x}As$--.

COLUMN 1

Line 27,  "m group" should read --III group--;
  Line 47,  "(1985)." should read --(1985)).--.

COLUMN 3

Line 67,  "still" should be deleted.

COLUMN 4

Line 1,   "laser has" should read --laser still has--;
  Line 62,  "Lime" should read --time--.

UNITED STATES PATENT AND TRADEMARK OFFICE
CERTIFICATE OF CORRECTION

PATENT NO. : 5,571,748

DATED : November 5, 1996

INVENTORS : SEIICHI MIYAZAWA ET AL.

It is certified that error appears in the above-identified patent and that said Letters Patent is hereby corrected as shown below:

COLUMN 7

Line 52, "temper" should read --temper- --.

COLUMN 8

Line 3, "tile" should read --the--.

COLUMN 9

Line 12, "Layer 12" should read --layer 12--;
Line 22, "ratioy" should read --ratio $\gamma$--.

COLUMN 12

Line 49, "D-side" should read --p-side--.

COLUMN 14

Line 43, "Ithe" should read --the--.

COLUMN 15

Line 15, "AuGe/NL/Au" should read --AuGe/Ni/Au--;
Line 21, "step 1" should read --step 1.--;

UNITED STATES PATENT AND TRADEMARK OFFICE
CERTIFICATE OF CORRECTION

PATENT NO. : 5,571,748

DATED : November 5, 1996

INVENTORS : SEIICHI MIYAZAWA ET AL.

It is certified that error appears in the above-identified patent and that said Letters Patent is hereby corrected as shown below:

<u>COLUMN 15</u> continued

Line 29,   "2 kA,/cm" should read --2 KA/cm--;
   Line 30,   ",that" should read --that--.

<u>COLUMN 18</u>

Line 13,   "epitaph" should read --epitaxy--.

Signed and Sealed this

Twenty-eighth Day of October, 1997

Attest:

BRUCE LEHMAN

*Attesting Officer*      *Commissioner of Patents and Trademarks*